(12) United States Patent
Hanson et al.

(10) Patent No.: US 7,264,698 B2
(45) Date of Patent: Sep. 4, 2007

(54) APPARATUS AND METHODS FOR ELECTROCHEMICAL PROCESSING OF MICROELECTRONIC WORKPIECES

(75) Inventors: Kyle M. Hanson, Kalispell, MT (US); Thomas L. Ritzdorf, Bigfork, MT (US); Gregory J. Wilson, Kalispell, MT (US); Paul R. McHugh, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 951 days.

(21) Appl. No.: 09/872,151

(22) Filed: May 31, 2001

(65) Prior Publication Data

US 2003/0127337 A1 Jul. 10, 2003

Related U.S. Application Data

(63) Continuation-in-part of application No. 09/804,697, filed on Mar. 12, 2001, now Pat. No. 6,660,137, which is a continuation of application No. PCT/US00/10120, filed on Apr. 13, 2000.

(60) Provisional application No. 60/294,690, filed on May 30, 2001, provisional application No. 60/129,055, filed on Apr. 13, 1999.

(51) Int. Cl.
*C25D 17/00* (2006.01)
*C25D 17/02* (2006.01)
*C25D 7/12* (2006.01)

(52) U.S. Cl. .................. 204/263; 204/260

(58) Field of Classification Search ............ 204/224 R, 204/275.1, DIG. 7
See application file for complete search history.

(56) References Cited

U.S. PATENT DOCUMENTS 1,526,644 A 2/1925 Pinney (Continued)

FOREIGN PATENT DOCUMENTS

CA 591894 2/1960

(Continued)

OTHER PUBLICATIONS

Patent Abstract of Japan, "Organic Compound and its Application," Publciation No. 08-003153, Publication Date: Jan. 9, 1996.

(Continued)

*Primary Examiner*—Harry D. Wilkins, III
(74) *Attorney, Agent, or Firm*—Perkins Coie LLP

(57) ABSTRACT

An apparatus and method for electrochemical processing of microelectronic workpieces in a reaction vessel. In one embodiment, the reaction vessel includes: an outer container having an outer wall; a distributor coupled to the outer container, the distributor having a first outlet configured to introduce a primary flow into the outer container and at least one second outlet configured to introduce a secondary flow into the outer container separate from the primary flow; a primary flow guide in the outer container coupled to the distributor to receive the primary flow from the first outlet and direct it to a workpiece processing site; a dielectric field shaping unit in the outer container coupled to the distributor to receive the secondary flow from the second outlet, the field shaping unit being configured to contain the secondary flow separate from the primary flow through at least a portion of the outer container, and the field shaping unit having at least one electrode compartment through which the secondary flow can pass while the secondary flow is separate from the primary flow; an electrode in the electrode compartment; and an interface member carried by the field shaping unit downstream from the electrode, the interface member being in fluid communication with the secondary flow in the electrode compartment, and the interface member being configured to prevent selected matter of the secondary flow from passing to the primary flow.

26 Claims, 9 Drawing Sheets

U.S. PATENT DOCUMENTS

| | | |
|---|---|---|
| 1,881,713 A | 10/1932 | Laukel |
| 2,256,274 A | 9/1941 | Boedecker et al. |
| 2,707,166 A | 4/1955 | Brown et al. |
| 3,124,520 A | 3/1964 | Juda |
| 3,309,263 A | 3/1967 | Grobe |
| 3,328,273 A | 6/1967 | Creutz et al. |
| 3,537,961 A | 11/1970 | White et al. |
| 3,616,284 A | 10/1971 | Bodmer et al. |
| 3,664,933 A | 5/1972 | Clauss |
| 3,706,635 A | 12/1972 | Kowalski |
| 3,706,651 A | 12/1972 | Leland |
| 3,716,462 A | 2/1973 | Jensen |
| 3,727,620 A | 4/1973 | Orr |
| 3,798,003 A | 3/1974 | Ensley et al. |
| 3,878,066 A | 4/1975 | Dettke et al. |
| 3,930,963 A | 1/1976 | Polichette et al. |
| 3,953,265 A | 4/1976 | Hood |
| 3,968,885 A | 7/1976 | Hassan et al. |
| 4,000,046 A | 12/1976 | Weaver |
| 4,022,679 A | 5/1977 | Koziol et al. |
| 4,030,015 A | 6/1977 | Herko et al. |
| 4,046,105 A | 9/1977 | Gomez |
| 4,072,557 A | 2/1978 | Schiel |
| 4,073,708 A | 2/1978 | Hicks |
| 4,082,638 A | 4/1978 | Jumer |
| 4,105,532 A | 8/1978 | Haines et al. |
| 4,113,577 A | 9/1978 | Ross et al. |
| 4,132,567 A | 1/1979 | Blackwood |
| 4,134,802 A | 1/1979 | Herr |
| 4,137,867 A | 2/1979 | Aigo |
| 4,165,252 A | 8/1979 | Gibbs |
| 4,170,959 A | 10/1979 | Aigo |
| 4,222,834 A | 9/1980 | Bacon et al. |
| 4,238,310 A | 12/1980 | Eckler et al. |
| 4,246,088 A | 1/1981 | Murphy et al. |
| 4,259,166 A | 3/1981 | Whitehurst |
| 4,269,670 A | 5/1981 | Smith |
| 4,276,855 A | 7/1981 | Seddon |
| 4,286,541 A | 9/1981 | Blackwood |
| 4,287,029 A | 9/1981 | Shimamura |
| 4,304,641 A | 12/1981 | Grandia et al. |
| 4,310,391 A | 1/1982 | Okinaka et al. |
| 4,323,433 A | 4/1982 | Loch |
| 4,341,629 A | 7/1982 | Uhlinger |
| 4,360,410 A | 11/1982 | Fletcher et al. |
| 4,378,283 A | 3/1983 | Seyffert |
| 4,384,930 A | 5/1983 | Eckles |
| 4,391,694 A | 7/1983 | Runsten |
| 4,422,915 A | 12/1983 | Wielonski et al. |
| 4,431,361 A | 2/1984 | Bayne |
| 4,437,943 A | 3/1984 | Beck et al. |
| 4,439,243 A | 3/1984 | Titus |
| 4,439,244 A | 3/1984 | Allevato |
| 4,440,597 A | 4/1984 | Wells et al. |
| 4,443,117 A | 4/1984 | Muramoto et al. |
| 4,449,885 A | 5/1984 | Hertel et al. |
| 4,451,197 A | 5/1984 | Lange |
| 4,463,503 A | 8/1984 | Applegate |
| 4,466,864 A | 8/1984 | Bacon et al. |
| 4,469,564 A | 9/1984 | Okinaka et al. |
| 4,469,566 A | 9/1984 | Wray |
| 4,475,823 A | 10/1984 | Stone |
| 4,480,028 A | 10/1984 | Kato et al. |
| 4,495,153 A | 1/1985 | Midorikawa |
| 4,495,453 A | 1/1985 | Inaba et al. |
| 4,500,394 A | 2/1985 | Rizzo |
| 4,529,480 A | 7/1985 | Trokhan |
| 4,541,895 A | 9/1985 | Albert |
| 4,544,446 A | 10/1985 | Cady |
| 4,566,847 A | 1/1986 | Maeda et al. |
| 4,576,685 A | 3/1986 | Goffredo et al. |
| 4,576,689 A | 3/1986 | Makkaev et al. |
| 4,585,539 A | 4/1986 | Edson |
| 4,604,177 A | 8/1986 | Sivilotti |
| 4,604,178 A | 8/1986 | Fiegener |
| 4,634,503 A | 1/1987 | Nogavich |
| 4,639,028 A | 1/1987 | Olson |
| 4,648,944 A | 3/1987 | George et al. |
| 4,652,345 A | 3/1987 | McBride et al. |
| 4,664,133 A | 5/1987 | Silvernail |
| 4,670,126 A | 6/1987 | Messer et al. |
| 4,685,414 A | 8/1987 | DiRico |
| 4,687,552 A | 8/1987 | Early et al. |
| 4,693,017 A | 9/1987 | Oehler et al. |
| 4,696,729 A | 9/1987 | Santini |
| 4,715,934 A | 12/1987 | Tamminen |
| 4,732,785 A | 3/1988 | Brewer |
| 4,741,624 A | 5/1988 | Barroyer |
| 4,750,505 A | 6/1988 | Inuta |
| 4,760,671 A | 8/1988 | Ward |
| 4,761,214 A | 8/1988 | Hinman |
| 4,770,590 A | 9/1988 | Hugues et al. |
| 4,778,572 A | 10/1988 | Brown |
| 4,781,800 A | 11/1988 | Goldman et al. |
| 4,790,262 A | 12/1988 | Nakayama |
| 4,800,818 A | 1/1989 | Kawaguchi et al. |
| 4,828,654 A | 5/1989 | Reed |
| 4,838,289 A | 6/1989 | Kottman |
| 4,849,054 A | 7/1989 | Klowak |
| 4,858,539 A | 8/1989 | Schumann |
| 4,864,239 A | 9/1989 | Casarcia et al. |
| 4,868,992 A | 9/1989 | Crafts et al. |
| 4,880,511 A | 11/1989 | Sugita |
| 4,898,647 A | 2/1990 | Luce et al. |
| 4,902,398 A | 2/1990 | Homstad |
| 4,903,717 A | 2/1990 | Sumnitsch |
| 4,906,340 A | 3/1990 | Brown |
| 4,906,341 A | 3/1990 | Yamakawa |
| 4,913,085 A | 4/1990 | Vohringer et al. |
| 4,924,890 A | 5/1990 | Giles et al. |
| 4,944,650 A | 7/1990 | Matsumoto |
| 4,948,476 A | 8/1990 | Kamperman et al. |
| 4,949,671 A | 8/1990 | Davis et al. |
| 4,951,601 A | 8/1990 | Maydan et al. |
| 4,959,278 A | 9/1990 | Shimauchi et al. |
| 4,962,726 A | 10/1990 | Matsushita et al. |
| 4,979,464 A | 12/1990 | Kunze-Concewitz et al. |
| 4,982,215 A | 1/1991 | Matsuoka |
| 4,982,753 A | 1/1991 | Grebinski |
| 4,988,533 A | 1/1991 | Freeman et al. |
| 5,000,827 A | 3/1991 | Schuster et al. |
| 5,020,200 A | 6/1991 | Mimasaka |
| 5,024,746 A | 6/1991 | Stierman et al. |
| 5,026,239 A | 6/1991 | Chiba |
| 5,032,217 A | 7/1991 | Tanaka |
| 5,047,126 A | 9/1991 | Greenberg |
| 5,048,589 A | 9/1991 | Cook et al. |
| 5,054,988 A | 10/1991 | Shiraiwa |
| 5,055,036 A | 10/1991 | Asano et al. |
| 5,061,144 A | 10/1991 | Akimoto et al. |
| 5,069,548 A | 12/1991 | Boehnlein |
| 5,078,852 A | 1/1992 | Yee |
| 5,083,364 A | 1/1992 | Olbrich et al. |
| 5,096,550 A | 3/1992 | Mayer et al. |
| 5,110,248 A | 5/1992 | Asano et al. |
| 5,115,430 A | 5/1992 | Hahne et al. |
| 5,117,769 A | 6/1992 | DeBoer |
| 5,125,784 A | 6/1992 | Asano |
| 5,128,912 A | 7/1992 | Hug et al. |
| 5,135,636 A | 8/1992 | Yee et al. |
| 5,138,973 A | 8/1992 | Davis |
| 5,146,136 A | 9/1992 | Ogura |
| 5,151,168 A | 9/1992 | Gilton et al. |
| 5,155,336 A | 10/1992 | Gronet et al. |

| | | | | | |
|---|---|---|---|---|---|
| 5,156,174 A | 10/1992 | Thompson | 5,454,405 A | 10/1995 | Hawes |
| 5,156,730 A | 10/1992 | Bhatt et al. | 5,460,478 A | 10/1995 | Akimoto et al. |
| 5,162,079 A | 11/1992 | Brown | 5,464,313 A | 11/1995 | Ohsawa |
| 5,168,886 A | 12/1992 | Thompson et al. | 5,472,502 A | 12/1995 | Batchelder |
| 5,168,887 A | 12/1992 | Thompson | 5,474,807 A | 12/1995 | Koshiishi |
| 5,169,408 A | 12/1992 | Biggerstaff et al. | 5,489,341 A | 2/1996 | Bergman et al. |
| 5,172,803 A | 12/1992 | Lewin | 5,500,081 A | 3/1996 | Bergman |
| 5,174,045 A | 12/1992 | Thompson et al. | 5,501,768 A | 3/1996 | Hermans et al. |
| 5,178,512 A | 1/1993 | Skrobak | 5,508,095 A | 4/1996 | Allum et al. |
| 5,178,639 A | 1/1993 | Nishi | 5,510,645 A | 4/1996 | Fitch |
| 5,180,273 A | 1/1993 | Salaya et al. | 5,512,319 A | 4/1996 | Cook et al. |
| 5,183,377 A | 2/1993 | Becker et al. | 5,513,594 A | 5/1996 | McClanahan |
| 5,186,594 A | 2/1993 | Toshima et al. | 5,514,258 A | 5/1996 | Brinket et al. |
| 5,209,180 A | 5/1993 | Shoda | 5,516,412 A | 5/1996 | Andricacos et al. |
| 5,209,817 A | 5/1993 | Ahmad et al. | 5,522,975 A | 6/1996 | Andricacos et al. |
| 5,217,586 A | 6/1993 | Datta et al. | 5,527,390 A | 6/1996 | Ono et al. |
| 5,222,310 A | 6/1993 | Thompson et al. | 5,544,421 A | 8/1996 | Thompson et al. |
| 5,224,503 A | 7/1993 | Thompson | 5,549,808 A | 8/1996 | Farooq et al. |
| 5,224,504 A | 7/1993 | Thompson et al. | 5,551,986 A | 9/1996 | Jain |
| 5,227,041 A | 7/1993 | Brogden et al. | 5,567,267 A | 10/1996 | Kazama et al. |
| 5,228,232 A | 7/1993 | Miles | 5,571,325 A | 11/1996 | Ueyama et al. |
| 5,228,966 A | 7/1993 | Murata | 5,575,611 A | 11/1996 | Thompson et al. |
| 5,230,371 A | 7/1993 | Lee | 5,584,310 A | 12/1996 | Bergman |
| 5,232,511 A | 8/1993 | Bergman | 5,584,971 A | 12/1996 | Komino |
| 5,235,995 A | 8/1993 | Bergman et al. | 5,591,262 A | 1/1997 | Sago |
| 5,238,500 A | 8/1993 | Bergman | 5,593,545 A | 1/1997 | Rugowski et al. |
| 5,252,137 A | 10/1993 | Tateyama et al. | 5,597,460 A | 1/1997 | Reynolds |
| 5,252,807 A | 10/1993 | Chizinsky | 5,597,836 A | 1/1997 | Hackler et al. |
| 5,256,262 A | 10/1993 | Blomsterberg | 5,600,532 A | 2/1997 | Michlya et al. |
| 5,256,274 A | 10/1993 | Poris | 5,609,239 A | 3/1997 | Schlecker |
| 5,271,953 A | 12/1993 | Litteral | 5,616,069 A | 4/1997 | Walker |
| 5,271,972 A | 12/1993 | Kwok et al. | 5,620,581 A | 4/1997 | Ang |
| 5,301,700 A | 4/1994 | Kamikawa et al. | 5,639,206 A | 6/1997 | Oda et al. |
| 5,302,464 A | 4/1994 | Nomura et al. | 5,639,316 A | 6/1997 | Cabral, Jr. et al. |
| 5,306,895 A | 4/1994 | Ushikoshi et al. | 5,641,613 A | 6/1997 | Boff et al. |
| 5,314,294 A | 5/1994 | Taniguchi | 5,650,082 A | 7/1997 | Anderson |
| 5,316,642 A | 5/1994 | Young | 5,651,823 A | 7/1997 | Parodi et al. |
| 5,326,455 A | 7/1994 | Kubo et al. | 5,658,183 A | 8/1997 | Sandhu |
| 5,330,604 A | 7/1994 | Allum et al. | 5,658,387 A | 8/1997 | Reardon |
| 5,332,271 A | 7/1994 | Grant et al. | 5,660,472 A | 8/1997 | Peuse et al. |
| 5,332,445 A | 7/1994 | Bergman | 5,660,517 A | 8/1997 | Thompson et al. |
| 5,340,456 A | 8/1994 | Mehler | 5,662,788 A | 9/1997 | Sandhu |
| 5,344,491 A | 9/1994 | Katou | 5,664,337 A | 9/1997 | Davis et al. |
| 5,348,620 A | 9/1994 | Hermans et al. | 5,666,985 A | 9/1997 | Smith |
| 5,349,978 A | 9/1994 | Sago | 5,670,034 A | 9/1997 | Lowery |
| 5,361,449 A | 11/1994 | Akimoto | 5,676,337 A | 10/1997 | Giras et al. |
| 5,363,171 A | 11/1994 | Mack | 5,677,118 A | 10/1997 | Spara et al. |
| 5,364,504 A | 11/1994 | Smurkoski et al. | 5,677,824 A | 10/1997 | Harashima |
| 5,366,785 A | 11/1994 | Sawdai | 5,678,116 A | 10/1997 | Sugimoto |
| 5,366,786 A | 11/1994 | Connor et al. | 5,678,320 A | 10/1997 | Thompson et al. |
| 5,368,711 A | 11/1994 | Poris | 5,681,392 A | 10/1997 | Swain |
| 5,372,848 A | 12/1994 | Blackwell et al. | 5,683,564 A | 11/1997 | Reynolds |
| 5,376,176 A | 12/1994 | Kuriyama | 5,684,654 A | 11/1997 | Searle et al. |
| 5,377,708 A | 1/1995 | Bergman et al. | 5,684,713 A | 11/1997 | Asada et al. |
| 5,388,945 A | 2/1995 | Garric et al. | 5,700,127 A | 12/1997 | Harada et al. |
| 5,391,285 A | 2/1995 | Lytle et al. | 5,700,180 A | 12/1997 | Sandhu |
| 5,391,517 A | 2/1995 | Gelatos et al. | 5,711,646 A | 1/1998 | Ueda et al. |
| 5,393,624 A | 2/1995 | Ushijima | 5,718,763 A | 2/1998 | Tateyama |
| 5,405,518 A | 4/1995 | Hsieh et al. | 5,719,495 A | 2/1998 | Moslehi |
| 5,411,076 A | 5/1995 | Matsunaga et al. | 5,723,028 A | 3/1998 | Poris |
| 5,421,893 A | 6/1995 | Perlov | 5,731,678 A | 3/1998 | Zila et al. |
| 5,421,987 A | 6/1995 | Tzanavaras et al. | 5,744,019 A | 4/1998 | Ang |
| 5,427,674 A | 6/1995 | Langenskiold et al. | 5,746,565 A | 5/1998 | Tepolt |
| 5,429,686 A | 7/1995 | Chiu et al. | 5,747,098 A | 5/1998 | Larson |
| 5,429,733 A | 7/1995 | Ishida | 5,754,842 A | 5/1998 | Minagawa |
| 5,431,421 A | 7/1995 | Thompson | 5,755,948 A | 5/1998 | Lazaro et al. |
| 5,431,803 A | 7/1995 | DiFranco et al. | 5,759,006 A | 6/1998 | Miyamoto et al. |
| 5,437,777 A | 8/1995 | Kishi | 5,762,708 A | 6/1998 | Motoda |
| 5,441,629 A | 8/1995 | Kosaki | 5,762,751 A | 6/1998 | Bleck et al. |
| 5,442,416 A | 8/1995 | Tateyama et al. | 5,765,444 A | 6/1998 | Bacchi et al. |
| 5,443,707 A | 8/1995 | Mori | 5,765,889 A | 6/1998 | Nam et al. |
| 5,445,484 A | 8/1995 | Kato et al. | 5,776,327 A | 7/1998 | Botts et al. |
| 5,447,615 A | 9/1995 | Ishida | 5,779,796 A | 7/1998 | Tomoeda |

| Patent | Date | Name |
|---|---|---|
| 5,785,826 A | 7/1998 | Greenspan |
| 5,788,829 A | 8/1998 | Joshi et al. |
| 5,802,856 A | 9/1998 | Schaper et al. |
| 5,815,762 A | 9/1998 | Sakai |
| 5,829,791 A | 11/1998 | Kotsubo et al. |
| 5,843,296 A | 12/1998 | Greenspan |
| 5,845,662 A | 12/1998 | Sumnitsch |
| 5,860,640 A | 1/1999 | Marohl |
| 5,868,866 A | 2/1999 | Maekawa |
| 5,871,626 A | 2/1999 | Crafts et al. |
| 5,871,805 A | 2/1999 | Lemelson |
| 5,872,633 A | 2/1999 | Holzapfel |
| 5,882,433 A | 3/1999 | Ueno |
| 5,882,498 A | 3/1999 | Dubin et al. |
| 5,883,762 A * | 3/1999 | Calhoun et al. ............ 205/119 |
| 5,885,755 A | 3/1999 | Nakagawa |
| 5,892,207 A | 4/1999 | Kawamura et al. |
| 5,900,663 A | 5/1999 | Johnson |
| 5,904,827 A | 5/1999 | Reynolds |
| 5,908,543 A | 6/1999 | Matsunami et al. |
| 5,916,366 A | 6/1999 | Ueyama |
| 5,924,058 A | 7/1999 | Waldhauer |
| 5,925,227 A | 7/1999 | Kobayashi et al. |
| 5,932,077 A | 8/1999 | Reynolds |
| 5,937,142 A | 8/1999 | Moslehi et al. |
| 5,942,035 A | 8/1999 | Hasebe |
| 5,948,203 A | 9/1999 | Wang |
| 5,952,050 A | 9/1999 | Doan |
| 5,957,836 A | 9/1999 | Johnson |
| 5,964,643 A | 10/1999 | Birang |
| 5,980,706 A | 11/1999 | Bleck et al. |
| 5,985,126 A | 11/1999 | Bleck et al. |
| 5,989,397 A | 11/1999 | Laube et al. |
| 5,989,406 A | 11/1999 | Beetz, Jr. et al. |
| 5,997,653 A | 12/1999 | Yamasaka |
| 5,998,123 A | 12/1999 | Tanaka et al. |
| 5,999,886 A | 12/1999 | Martin et al. |
| 6,001,235 A | 12/1999 | Arken et al. |
| 6,004,047 A | 12/1999 | Akimoto |
| 6,004,828 A | 12/1999 | Hanson |
| 6,017,437 A | 1/2000 | Ting |
| 6,017,820 A | 1/2000 | Ting et al. |
| 6,025,600 A | 2/2000 | Archie |
| 6,027,631 A | 2/2000 | Broadbent |
| 6,028,986 A | 2/2000 | Song |
| 6,045,618 A | 4/2000 | Raoux |
| 6,051,284 A | 4/2000 | Byrne et al. |
| 6,053,687 A | 4/2000 | Kirkpatrick |
| 6,063,190 A | 5/2000 | Hasebe et al. |
| 6,072,160 A | 6/2000 | Bahl |
| 6,072,163 A | 6/2000 | Armstrong et al. |
| 6,074,544 A | 6/2000 | Reid et al. |
| 6,077,412 A | 6/2000 | Ting |
| 6,080,288 A | 6/2000 | Schwartz et al. |
| 6,080,291 A | 6/2000 | Woodruff et al. |
| 6,080,691 A | 6/2000 | Lindsay et al. |
| 6,086,680 A | 7/2000 | Foster et al. |
| 6,090,260 A | 7/2000 | Inoue et al. |
| 6,091,498 A | 7/2000 | Hanson et al. |
| 6,099,702 A | 8/2000 | Reid |
| 6,099,712 A | 8/2000 | Ritzdorf |
| 6,103,085 A | 8/2000 | Woo et al. |
| 6,107,192 A | 8/2000 | Subrahmanyan et al. |
| 6,108,937 A | 8/2000 | Raaijmakers |
| 6,110,011 A | 8/2000 | Somekh |
| 6,110,346 A | 8/2000 | Reid et al. |
| 6,122,046 A | 9/2000 | Almogy |
| 6,126,798 A | 10/2000 | Reid et al. |
| 6,130,415 A | 10/2000 | Knoot |
| 6,132,289 A | 10/2000 | Labunsky |
| 6,136,163 A | 10/2000 | Cheung |
| 6,139,703 A | 10/2000 | Hanson et al. |
| 6,139,712 A | 10/2000 | Patton |
| 6,140,234 A | 10/2000 | Uzoh et al. |
| 6,143,147 A | 11/2000 | Jelinek |
| 6,143,155 A | 11/2000 | Adams |
| 6,149,729 A | 11/2000 | Iwata |
| 6,151,532 A | 11/2000 | Barone et al. |
| 6,156,167 A | 12/2000 | Patton et al. |
| 6,157,106 A | 12/2000 | Tietz et al. |
| 6,159,073 A | 12/2000 | Wiswesser |
| 6,159,354 A | 12/2000 | Contolini et al. |
| 6,162,344 A | 12/2000 | Reid et al. |
| 6,162,488 A | 12/2000 | Gevelber et al. |
| 6,168,693 B1 | 1/2001 | Uzoh |
| 6,168,695 B1 | 1/2001 | Woodruff |
| 6,174,425 B1 | 1/2001 | Simpson |
| 6,174,796 B1 | 1/2001 | Takagi et al. |
| 6,179,983 B1 | 1/2001 | Reid et al. |
| 6,365,729 B1 | 1/2001 | Tyagi |
| 6,184,068 B1 | 2/2001 | Ohtani et al. |
| 6,187,072 B1 | 2/2001 | Cheung |
| 6,190,234 B1 | 2/2001 | Swedek |
| 6,193,802 B1 | 2/2001 | Pang |
| 6,193,859 B1 | 2/2001 | Contolini |
| 6,194,628 B1 | 2/2001 | Pang |
| 6,197,181 B1 | 3/2001 | Chen |
| 6,199,301 B1 | 3/2001 | Wallace |
| 6,201,240 B1 | 3/2001 | Dotan |
| 6,208,751 B1 | 3/2001 | Almogy |
| 6,218,097 B1 | 4/2001 | Bell et al. |
| 6,221,230 B1 | 4/2001 | Takeuchi |
| 6,228,232 B1 | 5/2001 | Woodruff et al. |
| 6,231,743 B1 | 5/2001 | Etherington |
| 6,234,738 B1 | 5/2001 | Kimata et al. |
| 6,238,539 B1 | 5/2001 | Joyce |
| 6,244,931 B1 | 6/2001 | Pinson |
| 6,247,998 B1 | 6/2001 | Wiswesser |
| 6,251,238 B1 | 6/2001 | Kaufman et al. |
| 6,251,528 B1 | 6/2001 | Uzoh et al. |
| 6,251,692 B1 | 6/2001 | Hanson |
| 6,254,742 B1 | 7/2001 | Hanson et al. |
| 6,255,222 B1 | 7/2001 | Xia |
| 6,258,220 B1 | 7/2001 | Dordi |
| 6,261,433 B1 | 7/2001 | Landau |
| 6,264,752 B1 | 7/2001 | Curtis |
| 6,268,289 B1 | 7/2001 | Chowdhury |
| 6,270,619 B1 | 8/2001 | Suzuki |
| 6,270,634 B1 | 8/2001 | Khan |
| 6,270,647 B1 | 8/2001 | Graham |
| 6,277,194 B1 | 8/2001 | Thilderkvist |
| 6,277,263 B1 | 8/2001 | Chen |
| 6,278,089 B1 | 8/2001 | Young et al. |
| 6,280,183 B1 | 8/2001 | Mayur et al. |
| 6,280,582 B1 | 8/2001 | Woodruff et al. |
| 6,280,583 B1 | 8/2001 | Woodruff et al. |
| 6,290,865 B1 | 9/2001 | Lloyd |
| 6,297,154 B1 | 10/2001 | Gross et al. |
| 6,303,010 B1 | 10/2001 | Woodruff et al. |
| 6,309,520 B1 | 10/2001 | Woodruff et al. |
| 6,309,524 B1 | 10/2001 | Woodruff et al. |
| 6,309,981 B1 | 10/2001 | Mayer |
| 6,309,984 B1 | 10/2001 | Nonaka |
| 6,318,385 B1 | 11/2001 | Curtis |
| 6,318,951 B1 | 11/2001 | Schmidt et al. |
| 6,322,112 B1 | 11/2001 | Duncan |
| 6,322,677 B1 | 11/2001 | Woodruff et al. |
| 6,333,275 B1 | 12/2001 | Mayer |
| 6,342,137 B1 | 1/2002 | Woodruff et al. |
| 6,350,319 B1 | 2/2002 | Curtiss |
| 6,391,166 B1 * | 5/2002 | Wang .................... 204/224 R |
| 6,399,505 B2 | 6/2002 | Nogami |
| 6,402,923 B1 | 6/2002 | Mayer |
| 6,409,892 B1 | 6/2002 | Woodruff et al. |
| 6,413,436 B1 | 7/2002 | Aegerter |
| 6,423,642 B1 | 7/2002 | Peace |

| | | |
|---|---|---|
| 6,428,660 B2 | 8/2002 | Woodruff et al. |
| 6,428,662 B1 | 8/2002 | Woodruff et al. |
| 6,444,101 B1 | 9/2002 | Stevens |
| 6,471,913 B1 | 10/2002 | Weaver et al. |
| 6,481,956 B1 | 11/2002 | Hofmeister |
| 6,491,806 B1 | 12/2002 | Dubin |
| 6,494,221 B1 | 12/2002 | Sellmer |
| 6,497,801 B1 | 12/2002 | Woodruff |
| 6,527,920 B1 | 3/2003 | Mayer et al. |
| 6,562,421 B2 | 5/2003 | Sudo |
| 6,565,729 B2 | 5/2003 | Chen |
| 6,569,297 B2 | 5/2003 | Wilson |
| 6,569,299 B1 | 5/2003 | Reid et al. |
| 6,599,412 B1 | 7/2003 | Graham |
| 6,623,609 B2 | 9/2003 | Harris |
| 6,632,334 B2 | 10/2003 | Anderson |
| 6,660,137 B2 | 12/2003 | Wilson |
| 6,678,055 B2 | 1/2004 | Du-Nour et al. |
| 6,699,373 B2 | 3/2004 | Woodruff |
| 6,709,562 B1 | 3/2004 | Andricacos |
| 6,755,954 B2 | 6/2004 | Mayer et al. |
| 6,773,571 B1 | 8/2004 | Mayer et al. |
| 2001/0024611 A1 | 9/2001 | Woodruff |
| 2001/0032788 A1 | 10/2001 | Woodruff |
| 2001/0043856 A1 | 11/2001 | Woodruff |
| 2002/0008036 A1 | 1/2002 | Wang |
| 2002/0008037 A1 | 1/2002 | Wilson et al. |
| 2002/0022363 A1 | 2/2002 | Ritzdorf et al. |
| 2002/0032499 A1 | 3/2002 | Wilson et al. |
| 2002/0046952 A1 | 4/2002 | Graham |
| 2002/0079215 A1 | 6/2002 | Wilson et al. |
| 2002/0096508 A1 | 7/2002 | Weaver et al. |
| 2002/0125141 A1 | 9/2002 | Wilson |
| 2002/0139678 A1 | 10/2002 | Wilson |
| 2003/0020928 A1 | 1/2003 | Ritzdorf |
| 2003/0038035 A1 | 2/2003 | Wilson |
| 2003/0062258 A1 | 4/2003 | Woodruff |
| 2003/0066752 A1 | 4/2003 | Ritzdorf |
| 2003/0070918 A1 | 4/2003 | Hanson |
| 2003/0127337 A1 | 7/2003 | Hanson |
| 2004/0031693 A1 | 2/2004 | Chen |
| 2004/0055877 A1 | 3/2004 | Wilson |
| 2004/0099533 A1 | 5/2004 | Wilson |

FOREIGN PATENT DOCUMENTS

| | | |
|---|---|---|
| CA | 873651 | 6/1971 |
| CA | 1055883 | 6/1979 |
| DE | 41 14 427 | 11/1992 |
| DE | 4202194 | 7/1993 |
| DE | 195 25 666 | 10/1996 |
| EP | 0 140 404 A1 | 8/1984 |
| EP | 0047132 B1 | 7/1985 |
| EP | 0 677 612 A3 | 10/1985 |
| EP | 0 257 670 | 3/1988 |
| EP | 0 290 210 | 11/1988 |
| EP | 0290210 | 11/1988 |
| EP | 0 677 612 A2 | 10/1995 |
| EP | 0582019 B1 | 10/1995 |
| EP | 0544311 B1 | 5/1996 |
| EP | 0 881 673 A2 | 5/1998 |
| EP | 0 924 754 A2 | 10/1998 |
| EP | 0 982 771 A1 | 8/1999 |
| EP | 1 037 261 A2 | 3/2000 |
| EP | 1 069 213 A2 | 7/2000 |
| EP | 0452939 B1 | 11/2000 |
| EP | 105174 | 12/2000 |
| GB | 2217107 A | 3/1989 |
| GB | 2 254 288 A | 3/1992 |
| GB | 4109955 | 10/1992 |
| GB | 2 279 372 A | 6/1994 |
| JP | 52-12576 | 1/1977 |
| JP | 55-024924 | 2/1980 |
| JP | 56-112500 | 9/1981 |
| JP | 57-051477 | 3/1982 |
| JP | 59-150094 A * | 8/1984 |
| JP | 59-208831 | 11/1984 |
| JP | 60-137016 | 7/1985 |
| JP | 61-196534 | 8/1986 |
| JP | 62-166515 | 7/1987 |
| JP | 63-185029 | 7/1988 |
| JP | 1048442 | 2/1989 |
| JP | 1-120023 | 5/1989 |
| JP | 1-283845 | 11/1989 |
| JP | 4-94537 | 3/1992 |
| JP | 4144150 | 5/1992 |
| JP | 4311591 | 11/1992 |
| JP | 5-13322 | 1/1993 |
| JP | 5-21332 | 1/1993 |
| JP | 5146984 | 6/1993 |
| JP | 5195183 A | 8/1993 |
| JP | 5211224 | 8/1993 |
| JP | 5-326483 | 12/1993 |
| JP | 6017291 A | 1/1994 |
| JP | 6-45302 | 2/1994 |
| JP | 6073598 A | 3/1994 |
| JP | 6224202 A | 8/1994 |
| JP | 7113159 A | 5/1995 |
| JP | 7197299 A | 8/1995 |
| JP | 8-279494 | 11/1995 |
| JP | 9-181026 | 7/1997 |
| JP | 10-083960 | 3/1998 |
| JP | 11036096 A | 2/1999 |
| JP | 11080993 A | 3/1999 |
| WO | WO-90/00476 | 1/1990 |
| WO | WO-91/04213 | 4/1991 |
| WO | WO-95/06326 | 3/1995 |
| WO | WO-95/20064 | 7/1995 |
| WO | WO-99/16936 | 4/1996 |
| WO | WO-WO 99/16936 | 4/1996 |
| WO | WO-99/25904 | 5/1999 |
| WO | WO-99/25905 | 5/1999 |
| WO | WO-99/40615 | 8/1999 |
| WO | WO99/41434 | 8/1999 |
| WO | WO-99/45745 | 9/1999 |
| WO | WO-00/02675 | 1/2000 |
| WO | WO 00/02808 | 1/2000 |
| WO | WO-00/03072 | 1/2000 |
| WO | WO-02/02808 | 1/2000 |
| WO | WO-00/32835 | 6/2000 |
| WO | WO 00/61498 | 10/2000 |
| WO | WO 00/61837 | 10/2000 |
| WO | WO-01/46910 | 6/2001 |
| WO | WO 01/90434 | 11/2001 |
| WO | WO-01/91163 | 11/2001 |
| WO | WO-02/04886 | 1/2002 |
| WO | WO-02/04887 | 1/2002 |
| WO | WO-02/17203 | 2/2002 |
| WO | WO 02/045476 | 6/2002 |
| WO | WO-03/18874 | 9/2002 |
| WO | WO-02/97165 | 12/2002 |
| WO | WO 02/097165 | 12/2002 |
| WO | WO-02/99165 | 12/2002 |
| WO | WO 02/099165 | 12/2002 |

OTHER PUBLICATIONS

Patent Abstract of Japan, English Abstract Translation—Japanese Utility Model No. 2538705, Publication Date: Aug. 25, 1992.

Contolini et al., "Copper Electroplating Process for Sub-Half-Micron ULSI Structures," VMIC Conference 1995 ISMIC—04/95/0322, pp. 322-328, Jun. 17-29, 1995.

Devaraj et al., "Pulsed Electrodeposition of Copper," Plating & Surface Finishing, pp. 72-78, Aug. 1992.

Dubin, "Copper Plating Techniques for ULSI Metallization." Advanced MicroDevices (N.D.).

Dubin, V.M., "Electroch mical Deposition of Copper for On-Chip Interconnects," Advanced MicroDevices, N.D.

Gauvin et al., "The Effect of Chloride Ions on Copper Deposition," J. of Electrochemical Society, vol. 99, pp. 71-75, Feb. 1952.

Ossro, N.M., "An Overview of Pulse Plating," Plating and Surface Finishing, Mar. 1986.

Passal, F., "Copper Plating During the Last Fifty Years," Plating, pp. 628-638, Jun. 1959.

Patent Abstract of Japan, "Partial Plating Device," Publciation No. 01234590, Publication Date: Sep. 19, 1989.

Patent Abstract of Japan, "Plating Method" Publication No. 57171690, Publication Date: Oct. 22, 1982.

PCT International Search Report for PCT/US02/17840, Applicant: Semitool, Inc., Mar. 2003, 5 pages.

Singer, P., "Copper Goes Mainstream: Low k to Follow," Semiconductor International, pp. 67-70, Nov. 1997.

Lowenheim, Frederick A., "Electroplating," Electrochemistry Applied to Electroplating, 1978, pp. 152-155, McGraw-Hill Book Company, New York.

Ritter, et al., "Two- Three- Dimensional Numberical Modeling of Copper Electroplating For Advanced ULSI Metallization," E-MRS Conference symposium M. Basic Models to Enhance Reliability, Strasbourg (France) 1999, (N.M.).

International Search Report PCT/US02/17203, Semitool, Inc., Dec. 31, 2002, 4 pgs.

International Search Report for PCT/US02/17840; Applicant: Semitool, Inc., Mar. 3, 2003, 4 pgs.

Lee, Tien-Yu Tom, "Application of a CFD Tool in Designing a Fountain Plating Cell for Uniform Bump Plating of Semiconductor Wafers," IEE Transactions on Components, Packaging, and Manufacturing Technology (Feb. 1996), vol. 19, No. 1, IEEE.

Brown, H., "Function and Structure of Organic Additives in Electroplating," Udylite Co., Detroit, Michigan, date unknown.

Cherif, A.T. et al., "Sulfuric Acid Concentration with an Electro-Electrodialysis Process, " pp. 191-203, Hydrometallurgy, 21 (1988), Elsevier Science Publishers B.V.

Hampel, Clifford A., "Ion Exchange Membranes," The Encyclopedia of Electrochemistry, 1964, pp. 726-735, Reinhold Publishing Corporation, New York.

Kobuchi, Y. et al., "Application of Ion Exchange Membranes to the Recovery of Acids by Diffusion Dialysis and Electrodialysis," pp. 411-428, Synthetic Polymeric Membranes, 29th Microsymposium on Macromolecules, Prague, Czechoslovakia, Jul. 7-10, 1986, Walter de Gruyter & Co., New York.

Mayer, Linda et al., "Characteristics of Acid Copper Sulfate Deposits for Printed Wiring Board Applications," Plating and Surface Finishing, Journal of the American Electroplaters' Society, pp. 46-49, Mar. 1981, vol. 68, No. 3.

* cited by examiner

APPARATUS AND METHODS FOR ELECTROCHEMICAL PROCESSING OF MICROELECTRONIC WORKPIECES

CROSS-REFERENCE TO RELATED APPLICATIONS

This application is a continuation-in-part of U.S. application Ser. No. 09/804,697, entitled "SYSTEM FOR ELECTROCHEMICALLY PROCESSING A WORKPIECE," filed on Mar. 12, 2001 now U.S. Pat. No. 6,660,137; which is a continuation of International Application No. PCT/US00/10120, filed on Apr. 13, 2000, in the English language and published in the English language as International Publication No. WO00/61498, which claims the benefit of Provisional Application No. 60/129,055, filed on Apr 13, 1999, all of which are herein incorporated by reference. This application also claims the benefit of U.S. Application No. 60/294,690, filed on May 30, 2001.

TECHNICAL FIELD

This application relates to reaction vessels and methods of making and using such vessels in electrochemical processing of microelectronic workpieces.

BACKGROUND

Microelectronic devices, such as semiconductor devices and field emission displays, are generally fabricated on and/or in microelectronic workpieces using several different types of machines ("tools"). Many such processing machines have a single processing station that performs one or more procedures on the workpieces. Other processing machines have a plurality of processing stations that perform a series of different procedures on individual workpieces or batches of workpieces. In a typical fabrication process, one or more layers of conductive materials are formed on the workpieces during deposition stages. The workpieces are then typically subject to etching and/or polishing procedures (i.e., planarization) to remove a portion of the deposited conductive layers for forming electrically isolated contacts and/or conductive lines.

Plating tools that plate metals or other materials on the workpieces are becoming an increasingly useful type of processing machine. Electroplating and electroless plating techniques can be used to deposit copper, solder, permalloy, gold, silver, platinum and other metals onto workpieces for forming blanket layers or patterned layers. A typical copper plating process involves depositing a copper seed layer onto the surface of the workpiece using chemical vapor deposition (CVD), physical vapor deposition (PVD), electroless plating processes, or other suitable methods. After forming the seed layer, a blanket layer or patterned layer of copper is plated onto the workpiece by applying an appropriate electrical potential between the seed layer and an anode in the presence of an electroprocessing solution. The workpiece is then cleaned, etched and/or annealed in subsequent procedures before transferring the workpiece to another processing machine.

FIG. 1 illustrates an embodiment of a single-wafer processing station 1 that includes a container 2 for receiving a flow of electroplating solution from a fluid inlet 3 at a lower portion of the container 2. The processing station 1 can include an anode 4, a plate-type diffuser 6 having a plurality of apertures 7, and a workpiece holder 9 for carrying a workpiece 5. The workpiece holder 9 can include a plurality of electrical contacts for providing electrical current to a seed layer on the surface of the workpiece 5. When the seed layer is biased with a negative potential relative to the anode 4, it acts as a cathode. In operation the electroplating fluid flows around the anode 4, through the apertures 7 in the diffuser 6 and against the plating surface of the workpiece 5. The electroplating solution is an electrolyte that conducts electrical current between the anode 4 and the cathodic seed layer on the surface of the workpiece 5. Therefore, ions in the electroplating solution plate the surface of the workpiece 5.

The plating machines used in fabricating microelectronic devices must meet many specific performance criteria. For example, many processes must be able to form small contacts in vias that are less than 0.5 μm wide, and are desirably less than 0.1 μm wide. The plated metal layers accordingly often need to fill vias or trenches that are on the order of 0.1 μm wide, and the layer of plated material should also be deposited to a desired, uniform thickness across the surface of the workpiece 5. One factor that influences the uniformity of the plated layer is the mass transfer of electroplating solution at the surface of the workpiece. This parameter is generally influenced by the velocity of the flow of the electroplating solution perpendicular to the surface of the workpiece. Another factor that influences the uniformity of the plated layer is the current density of the electrical field across the surface of the wafer.

One concern of existing electroplating equipment is providing a uniform mass transfer at the surface of the workpiece. Referring to FIG. 1, existing plating tools generally use the diffuser 6 to enhance the uniformity of the fluid flow perpendicular to the face of the workpiece. Although the diffuser 6 improves the uniformity of the fluid flow, it produces a plurality of localized areas of increased flow velocity perpendicular to the surface of the workpiece 5 (indicated by arrows 8). The localized areas generally correspond to the position of the apertures 7 in the diffuser 6. The increased velocity of the fluid flow normal to the substrate in the localized areas increases the mass transfer of the electroplating solution in these areas. This typically results in faster plating rates in the localized areas over the apertures 7. Although many different configurations of apertures have been used in plate-type diffusers, these diffusers may not provide adequate uniformity for the precision required in many current applications.

Another concern of existing plating tools is that the diffusion layer in the electroplating solution adjacent to the surface of the workpiece 5 can be disrupted by gas bubbles or particles. For example, bubbles can be introduced to the plating solution by the plumbing and pumping system of the processing equipment, or they can evolve from inert anodes. Consumable anodes are often used to prevent or reduce the evolvement of gas bubbles in the electroplating solution, but these anodes erode and they can form a passivated film surface that must be maintained. Consumable anodes, moreover, often generate particles that can be carried in the plating solution. As a result, gas bubbles and/or particles can flow to the surface of the workpiece 5, which disrupts the uniformity and affects the quality of the plated layer.

Still another challenge of plating uniform layers is providing a desired electrical field at the surface of the workpiece 5. The distribution of electrical current in the plating solution is a function of the uniformity of the seed layer across the contact surface, the configuration/condition of the anode, and the configuration of the chamber. However, the current density profile on the plating surface can change. For example, the current density profile typically changes during a plating cycle because plating material covers the seed layer, or it can change over a longer period of time because the shape of consumable anodes changes as they erode and the concentration of constituents in the plating solution can change. Therefore, it can be difficult to maintain a desired current density at the surface of the workpiece 5.

SUMMARY

The present invention is directed toward reaction vessels for electrochemical processing of microelectronic workpieces, processing stations including such reaction vessels, and methods for using these devices. Several embodiments of reaction vessels in accordance with the invention solve the problem of providing a desired mass transfer at the workpiece by configuring the electrodes so that a primary flow guide and/or a field shaping unit in the reaction vessel direct a substantially uniform primary fluid flow toward the workpiece. Additionally, field shaping units in accordance with several embodiments of the invention create virtual electrodes such that the workpiece is shielded from the electrodes. This allows for the use of larger electrodes to increase electrode life, eliminates the need to "burn-in" electrodes to decrease downtime, and/or provides the capability of manipulating the electrical field by merely controlling the electrical current to one or more of the electrodes in the vessel. Furthermore, additional embodiments of the invention include interface members in the reaction vessel that inhibit particulates, bubbles and other undesirable matter in the reaction vessel from contacting the workpiece to enhance the uniformity and the quality of the finished surface on the workpieces. The interface members can also allow two different types of fluids to be used in the reaction vessel, such as a catholyte and an anolyte, to reduce the need to replenish additives as often and to add more flexibility to designing electrodes and other components in the reaction vessel.

In one embodiment of the invention, a reaction vessel includes an outer container having an outer wall, a first outlet configured to introduce a primary fluid flow into the outer container, and at least one second outlet configured to introduce a secondary fluid flow into the outer container separate from the primary fluid flow. The reaction vessel can also include a field shaping unit in the outer container and at least one electrode. The field shaping unit can be a dielectric assembly coupled to the second outlet to receive the secondary flow and configured to contain the secondary flow separate from the primary flow through at least a portion of the outer container. The field shaping unit also has at least one electrode compartment through which the secondary flow can pass separately from the primary flow. The electrode is positioned in the electrode compartment.

In a particular embodiment, the field shaping unit has a compartment assembly having a plurality of electrode compartments and a virtual electrode unit. The compartment assembly can include a plurality of annular walls including an inner or first annular wall centered on a common axis and an outer or second annular wall concentric with the first annular wall and spaced radially outward. The annular walls of the field shaping unit can be positioned inside of outer wall of the outer container so that an annular space between the first and second walls defines a first electrode compartment and an annular space between the second wall and the outer wall defines a second electrode compartment. The reaction vessel of this particular embodiment can have a first annular electrode in the first electrode compartment and/or a second annular electrode in the second electrode compartment.

The virtual electrode unit can include a plurality of partitions that have lateral sections attached to corresponding annular walls of the electrode compartment and lips that project from the lateral sections. In one embodiment, the first partition has an annular first lip that defines a central opening, and the second partition has an annular second lip surrounding the first lip that defines an annular opening.

In additional embodiments, the reaction vessel can further include a distributor coupled to the outer container and a primary flow guide in the outer container. The distributor can include the first outlet and the second outlet such that the first outlet introduces the primary fluid flow into the primary flow guide and the second outlet introduces the secondary fluid flow into the field shaping unit separately from the primary flow. The primary flow guide can condition the primary flow for providing a desired fluid flow to a workpiece processing site. In one particular embodiment, the primary flow guide directs the primary flow through the central opening of the first annular lip of the first partition. The secondary flow is distributed to the electrode compartments of the field shaping unit to establish an electrical field in the reaction vessel.

In the operation of one embodiment, the primary flow can pass through a first flow channel defined, at least in part, by the primary flow guide and the lip of the first partition. The primary flow can be the dominant flow through the reaction vessel so that it controls the mass transfer at the workpiece. The secondary flow can generally be contained within the field shaping unit so that the electrical field(s) of the electrode(s) are shaped by the virtual electrode unit and the electrode compartments. For example, in the embodiment having first and second annular electrodes, the electrical effect of the first electrode can act as if it is placed in the central opening defined by the lip of the first partition, and the electrical effect of the second electrode can act as if it is placed in the annular opening between the first and second lips. The actual electrodes, however, can be shielded from the workpiece by the field shaping unit such that the size and shape of the actual electrodes does not affect the electrical field perceived by the workpiece.

One feature of several embodiments is that the field shaping unit shields the workpiece from the electrodes. As a result, the electrodes can be much larger than they could without the field shaping unit because the size and configuration of the actual electrodes does not appreciably affect the electrical field perceived by the workpiece. This is particularly useful when the electrodes are consumable anodes because the increased size of the anodes prolongs their life, which reduces downtime for servicing a tool. Additionally, this reduces the need to "burn-in" anodes because the field shaping element reduces the impact that films on the anodes have on the shape of the electrical field perceived by the workpiece. Both of these benefits significantly improve the operating efficiency of the reaction vessel.

Another feature of several embodiments of the invention is that they provide a uniform mass transfer at the surface of the workpiece. Because the field shaping unit separates the actual electrodes from the effective area where they are perceived by the workpiece, the actual electrodes can be configured to accommodate internal structure that guides the flow along a more desirable flow path. For example, this allows the primary flow to flow along a central path. Moreover, a particular embodiment includes a central primary flow guide that projects the primary flow radially inward along diametrically opposed vectors that create a highly uniform primary flow velocity in a direction perpendicular to the surface of the workpiece.

The reaction vessel can also include an interface member carried by the field shaping unit downstream from the electrode. The interface member can be in fluid communication with the secondary flow in the electrode compartment. The interface member, for example, can be a filter and/or an ion-membrane. In either case, the interface member can inhibit particulates (e.g., particles from an anode) and bubbles in the secondary flow from reaching the surface of the workpiece to reduce non-uniformities on the processed surface. This accordingly increases the quality of the surface of the workpiece. Additionally, in the case of an ion-membrane, the interface member can be configured to prevent fluids from passing between the secondary flow and the primary flow while allowing preferred ions to pass between the flows. This allows the primary flow and the secondary flow to be different types of fluids, such as a catholyte and an anolyte, which reduces the need to replenish additives as often and adds more flexibility to designing electrodes and other features of the reaction vessel.

DETAILED DESCRIPTION

The following description discloses the details and features of several embodiments of electrochemical reaction vessels for use in electrochemical processing stations and integrated tools to process microelectronic workpieces. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the art to make and use the disclosed embodiments. Several of the details and advantages described below, however, may not be necessary to practice certain embodiments of the invention. Additionally, the invention can also include additional embodiments that are within the scope of the claims, but are not described in detail with respect to FIGS. 2-8B.

The operation and features of electrochemical reaction vessels are best understood in light of the environment and equipment in which they can be used to electrochemically process workpieces (e.g., electroplate and/or electropolish). As such, embodiments of integrated tools with processing stations having the electrochemical reaction vessels are initially described with reference to FIGS. 2 and 3. The details and features of several embodiments of electrochemical reaction vessels are then described with reference to FIGS. 4-8B.

Figure 1:
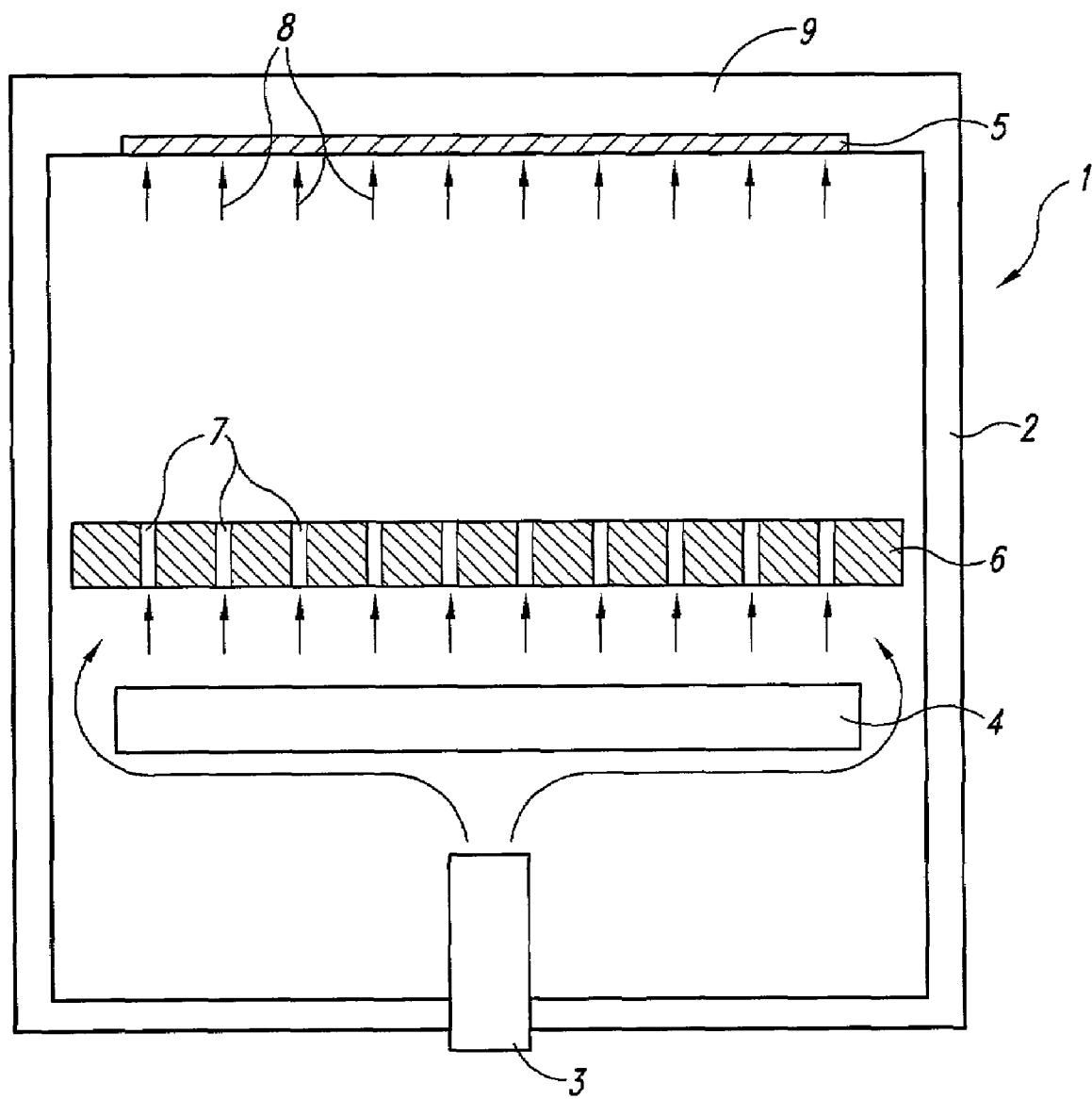
FIG. 1 is a schematic diagram of an electroplating chamber in accordance with the prior art.
Figure 2:
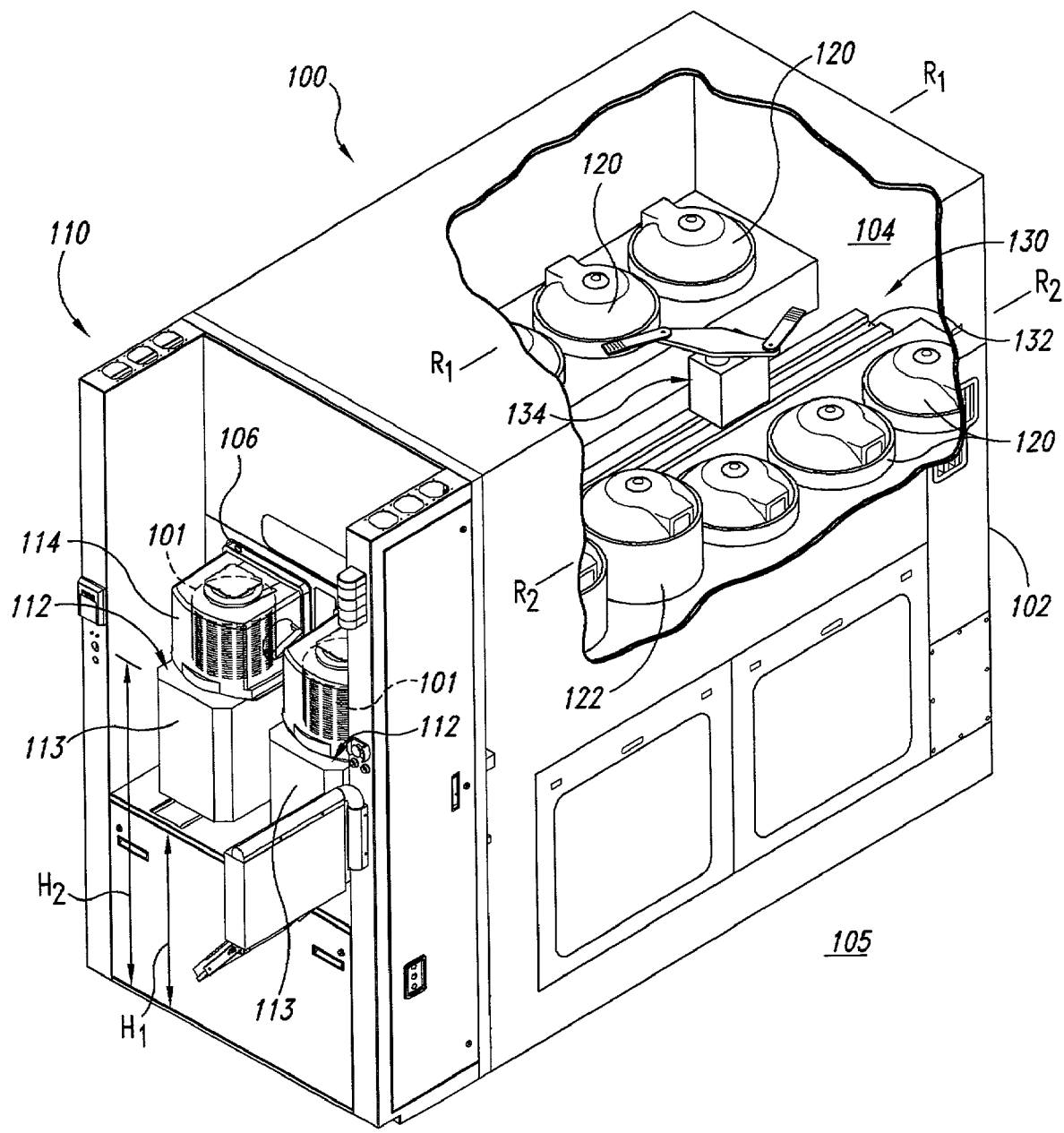
FIG. 2 is an isometric view of an electroprocessing machine having electroprocessing stations for processing microelectronic workpieces in accordance with an embodiment of the invention.

A. Selected Embodiments of Integrated Tools with Electrochemical Processing Stations FIG. 2 is an isometric view of a processing machine 100 having an electrochemical processing station 120 in accordance with an embodiment of the invention. A portion of the processing machine 100 is shown in a cut-away view to illustrate selected internal components. In one aspect of this embodiment, the processing machine 100 can include a cabinet 102 having an interior region 104 defining an interior enclosure that is at least partially isolated from an exterior region 105. The cabinet 102 can also include a plurality of apertures 106 (only one shown in FIG. 1) through which microelectronic workpieces 101 can ingress and egress between the interior region 104 and a load/unload station 110.

The load/unload station 110 can have two container supports 112 that are each housed in a protective shroud 113. The container supports 112 are configured to position workpiece containers 114 relative to the apertures 106 in the cabinet 102. The workpiece containers 114 can each house a plurality of microelectronic workpieces 101 in a "mini" clean environment for carrying a plurality of workpieces through other environments that are not at clean room standards. Each of the workpiece containers 114 is accessible from the interior region 104 of the cabinet 102 through the apertures 106.

The processing machine 100 can also include a plurality of electrochemical processing stations 120 and a transfer device 130 in the interior region 104 of the cabinet 102. The processing machine 100, for example, can be a plating tool that also includes clean/etch capsules 122, electroless plating stations, annealing stations, and/or metrology stations.

The transfer device 130 includes a linear track 132 extending in a lengthwise direction of the interior region 104 between the processing stations. The transfer device 130 can further include a robot unit 134 carried by the track 132. In the particular embodiment shown in FIG. 2, a first set of processing stations is arranged along a first row $R_1$-$R_1$ and a second set of processing stations is arranged along a second row $R_2$-$R_2$. The linear track 132 extends between the first and second rows of processing stations, and the robot unit 134 can access any of the processing stations along the track 132.

Figure 3:
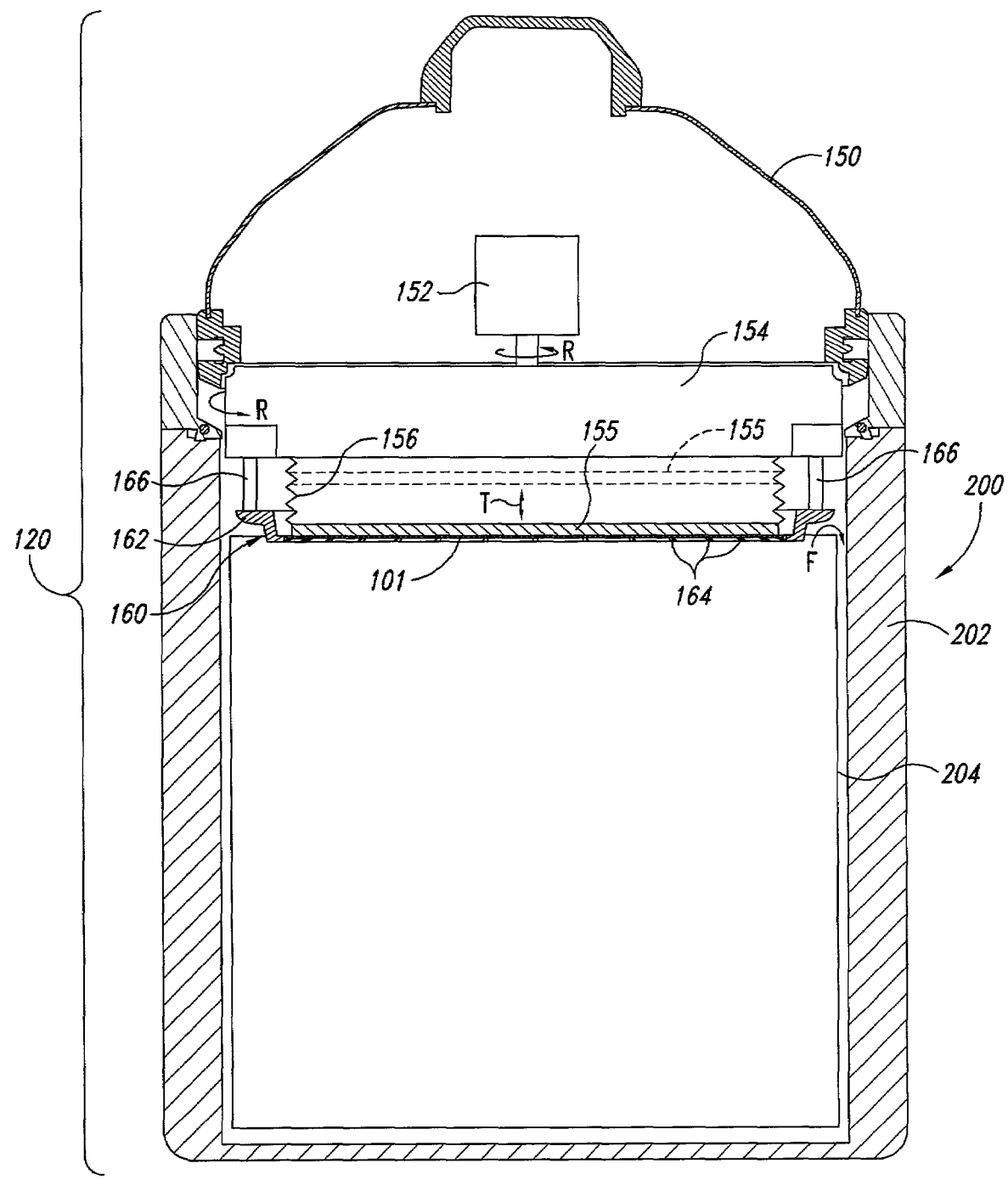
FIG. 3 is a cross-sectional view of an electroprocessing station having a processing chamber for use in an electroprocessing machine in accordance with an embodiment of the invention. Selected components in FIG. 3 are shown schematically.

FIG. 3 illustrates an embodiment of an electrochemical-processing chamber 120 having a head assembly 150 and a processing chamber 200. The head assembly 150 includes a spin motor 152, a rotor 154 coupled to the spin motor 152, and a contact assembly 160 carried by the rotor 154. The rotor 154 can have a backing plate 155 and a seal 156. The backing plate 155 can move transverse to a workpiece 101

(arrow T) between a first position in which the backing plate 155 contacts a backside of the workpiece 101 (shown in solid lines in FIG. 3) and a second position in which it is spaced apart from the backside of the workpiece 101 (shown in broken lines in FIG. 3). The contact assembly 160 can have a support member 162, a plurality of contacts 164 carried by the support member 162, and a plurality of shafts 166 extending between the support member 162 and the rotor 154. The contacts 164 can be ring-type spring contacts or other types of contacts that are configured to engage a portion of the seed-layer on the workpiece 101. Commercially available head assemblies 150 and contact assemblies 160 can be used in the electroprocessing chamber 120. Particular suitable head assemblies 150 and contact assemblies 160 are disclosed in U.S. Pat. Nos. 6,228,232 and 6,080,691; and U.S. application Ser. Nos. 09/385,784; 09/386,803; 09/386,610; 09/386,197; 09/501,002; 09/733,608; and 09/804,696, all of which are herein incorporated by reference.

The processing chamber 200 includes an outer housing 202 (shown schematically in FIG. 3) and a reaction vessel 204 (also shown schematically in FIG. 3) in the housing 202. The reaction vessel 204 carries at least one electrode (not shown in FIG. 3) and directs a flow of electroprocessing solution to the workpiece 101. The electroprocessing solution, for example, can flow over a weir (arrow F) and into the external housing 202, which captures the electroprocessing solution and sends it back to a tank. Several embodiments of reaction vessels 204 are shown and described in detail with reference to FIGS. 4-8B.

In operation the head assembly 150 holds the workpiece at a workpiece-processing site of the reaction vessel 204 so that at least a plating surface of the workpiece engages the electroprocessing solution. An electrical field is established in the solution by applying an electrical potential between the plating surface of the workpiece via the contact assembly 160 and one or more electrodes in the reaction vessel 204. For example, the contact assembly 160 can be biased with a negative potential with respect to the electrode(s) in the reaction vessel 204 to plate materials onto the workpiece. On the other hand the contact assembly 160 can be biased with a positive potential with respect to the electrode(s) in the reaction vessel 204 to (a) de-plate or electropolish plated material from the workpiece or (b) deposit other materials (e.g., electrophoric resist). In general, therefore, materials can be deposited on or removed from the workpiece with the workpiece acting as a cathode or an anode depending upon the particular type of material used in the electrochemical process.

B. Selected Embodiments of Reaction Vessels for use in Electrochemical Processing Chambers FIGS. 4-8B illustrate several embodiments of reaction vessels 204 for use in the processing chamber 200. As explained above, the housing 202 carries the reaction vessel 204. The housing 202 can have a drain 210 for returning the processing fluid that flows out of the reaction vessel 204 to a storage tank, and a plurality of openings for receiving inlets and electrical fittings. The reaction vessel 204 can include an outer container 220 having an outer wall 222 spaced radially inwardly of the housing 202. The outer container 220 can also have a spiral spacer 224 between the outer wall 222 and the housing 202 to provide a spiral ramp (i.e., a helix) on which the processing fluid can flow downward to the bottom of the housing 202. The spiral ramp reduces the turbulence of the return fluid to inhibit entrainment of gasses in the return fluid.

Figure 4:
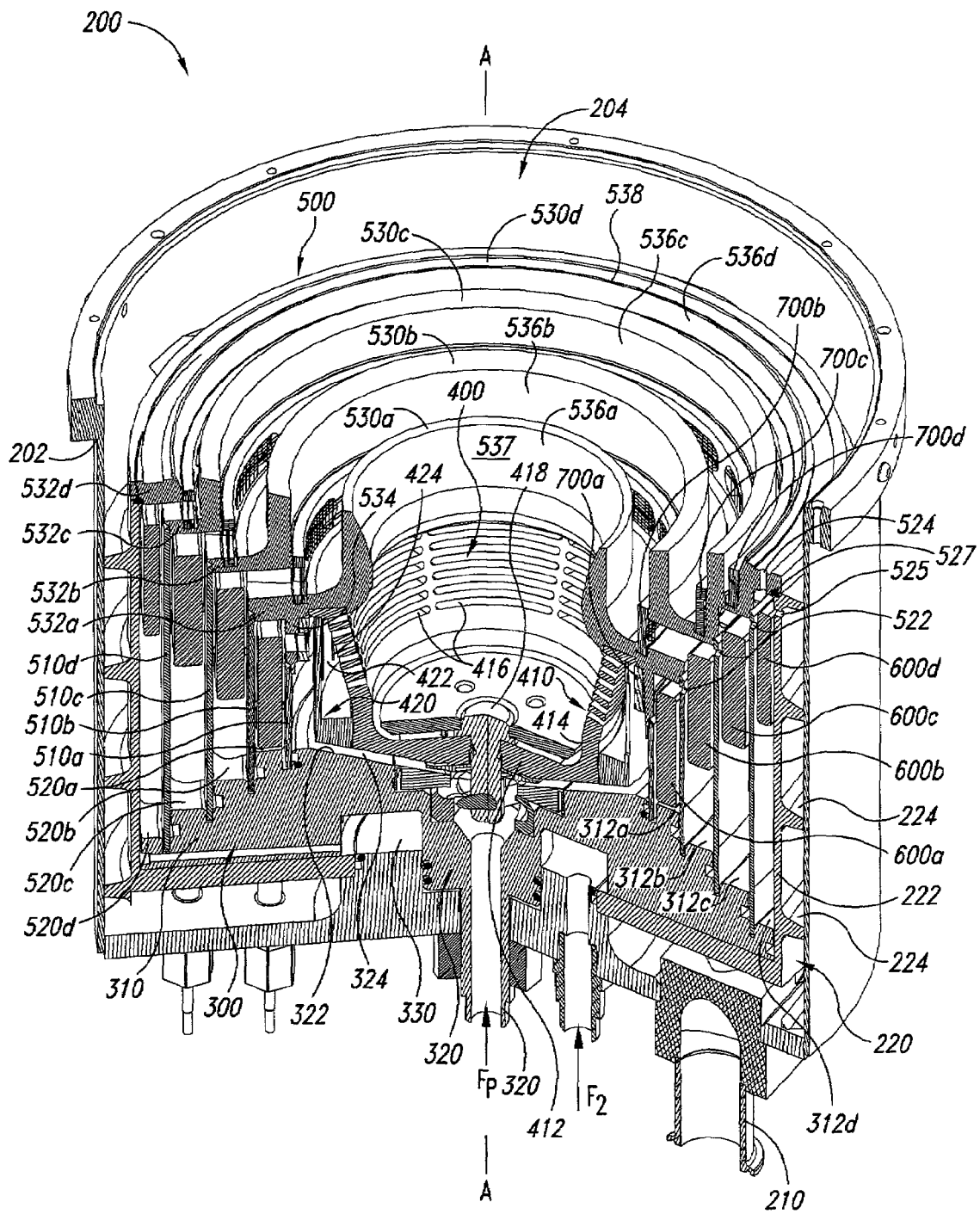
FIG. 4 is an isometric view showing a cross-sectional portion of a processing chamber taken along line 4-4 of FIG. 8A.

The particular embodiment of the reaction vessel 204 shown in FIG. 4 can include a distributor 300 for receiving a primary fluid flow $F_p$ and a secondary fluid flow $F_2$, a primary flow guide 400 coupled to the distributor 300 to condition the primary fluid flow $F_p$, and a field shaping unit 500 coupled to the distributor 300 to contain the secondary flow $F_2$ in a manner that shapes the electrical field in the reaction vessel 204. The reaction vessel 204 can also include at least one electrode 600 in a compartment of the field shaping unit 500 and at least one filter or other type of interface member 700 carried by the field shaping unit 500 downstream from the electrode. The primary flow guide 400 can condition the primary flow $F_p$ by projecting this flow radially inwardly relative to a common axis A-A, and a portion of the field shaping unit 500 directs the conditioned primary flow $F_p$ toward the workpiece. In several embodiments, the primary flow passing through the primary flow guide 400 and the center of the field shaping unit 500 controls the mass transfer of processing solution at the surface of the workpiece. The field shaping unit 500 also defines the shape the electric field, and it can influence the mass transfer at the surface of the workpiece if the secondary flow passes through the field shaping unit. The reaction vessel 204 can also have other configurations of components to guide the primary flow $F_p$ and the secondary flow $F_2$ through the processing chamber 200. The reaction vessel 204, for example, may not have a distributor in the processing chamber, but rather separate fluid lines with individual flows can be coupled to the vessel 204 to provide a desired distribution of fluid through the primary flow guide 400 and the field shaping unit. For example, the reaction vessel 204 can have a first outlet in the outer container 220 for introducing the primary flow into the reaction vessel and a second outlet in the outer container for introducing the secondary flow into the reaction vessel 204. Each of these components is explained in more detail below.

Figure 5A:
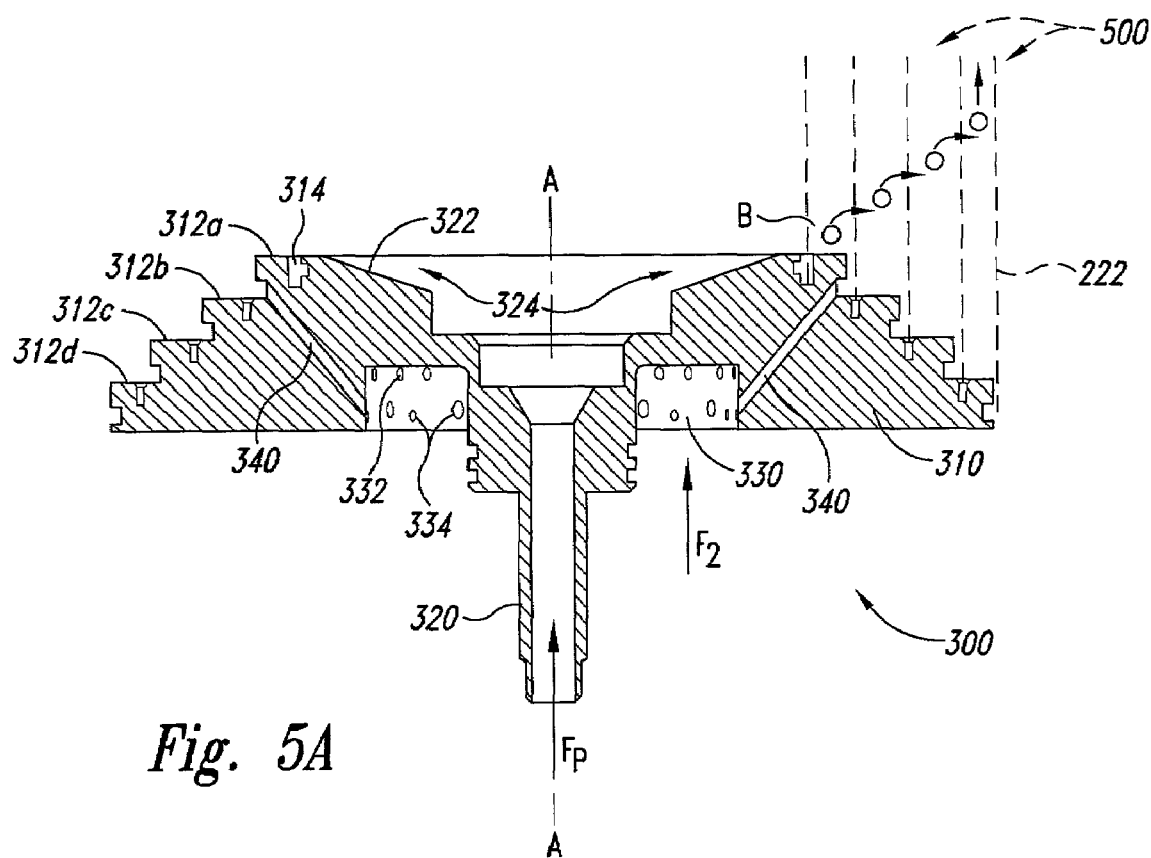
FIGS. 5A-5D are cross-sectional views of a distributor for a processing chamber in accordance with an embodiment of the invention.

FIGS. 5A-5D illustrate an embodiment of the distributor 300 for directing the primary fluid flow to the primary flow guide 400 and the secondary fluid flow to the field shaping unit 500. Referring to FIG. 5A, the distributor 300 can include a body 310 having a plurality of annular steps 312 (identified individually by reference numbers 312a-d) and annular grooves 314 in the steps 312. The outermost step 312d is radially inward of the outer wall 222 (shown in broken lines) of the outer container 220 (FIG. 4), and each of the interior steps 312a-c can carry an annular wall (shown in broken lines) of the field shaping unit 500 in a corresponding groove 314. The distributor 300 can also include a first inlet 320 for receiving the primary flow $F_p$ and a plenum 330 for receiving the secondary flow $F_2$. The first inlet 320 can have an inclined, annular cavity 322 to form a passageway 324 (best shown in FIG. 4) for directing the primary fluid flow $F_p$ under the primary flow guide 400. The distributor 300 can also have a plurality of upper orifices 332 along an upper part of the plenum 330 and a plurality of lower orifices 334 along a lower part of the plenum 330. As explained in more detail below, the upper and lower orifices are open to channels through the body 310 to distribute the secondary flow $F_2$ to the risers of the steps 312. The distributor 300 can also have other configurations, such as a "step-less" disk or non-circular shapes.

Figure 5B:
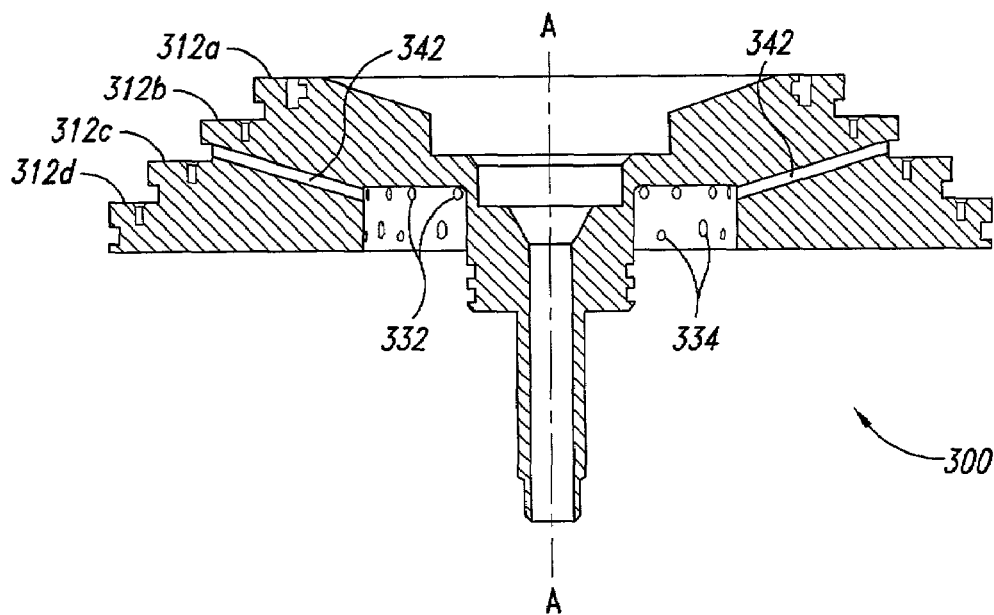
Figure 5C:
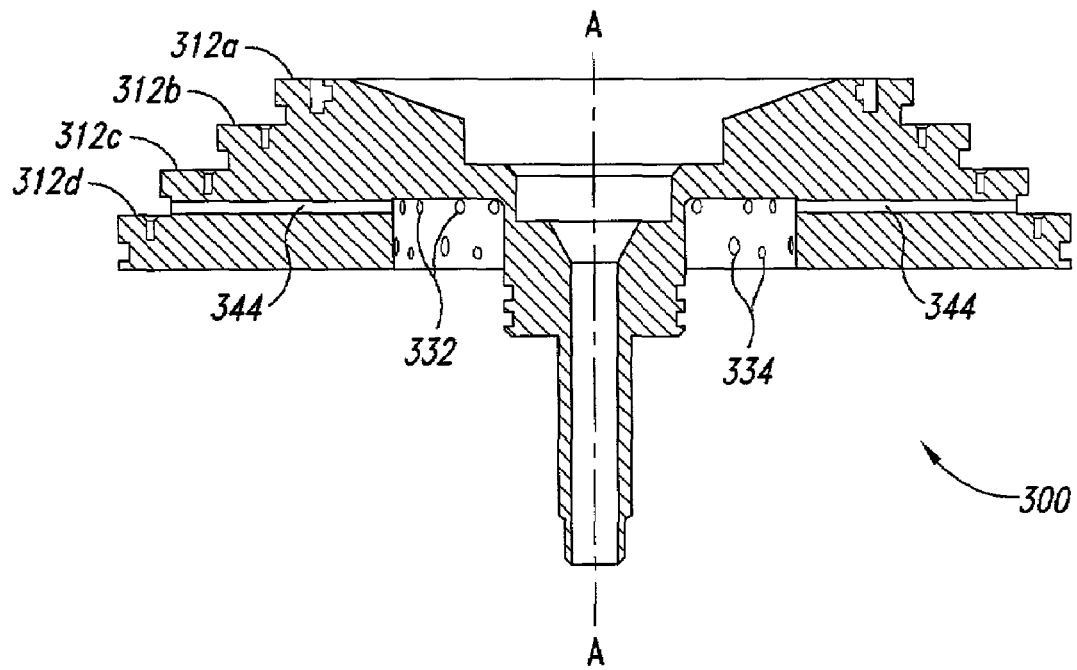
Figure 5D:
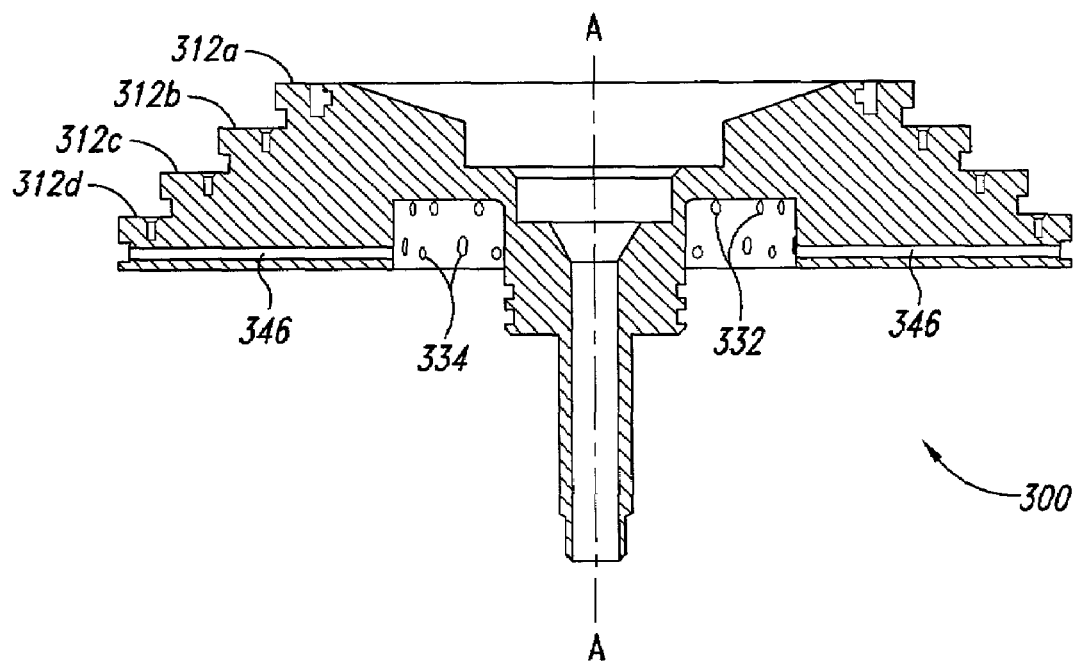

FIGS. 5A-5D further illustrate one configuration of channels through the body 310 of the distributor 300. Referring to FIG. 5A, a number of first channels 340 extend from some of the lower orifices 334 to openings at the riser of the first step 312a. FIG. 5B shows a number of second channels 342 extending from the upper orifices 332 to openings at the riser of the second step 312b, and FIG. 5C shows a number of third channels 344 extending from the upper orifices 332 to openings at the riser of the third step 312c. Similarly, FIG. 5D illustrates a number of fourth channels 346 extending from the lower orifices 334 to the riser of the fourth step 312d.

The particular embodiment of the channels 340-346 in FIGS. 5A-5D are configured to transport bubbles that collect in the plenum 330 radially outward as far as practical so that these bubbles can be captured and removed from the secondary flow $F_2$. This is beneficial because the field shaping unit 500 removes bubbles from the secondary flow $F_2$ by sequentially transporting the bubbles radially outwardly through electrode compartments. For example, a bubble B in the compartment above the first step 312a can sequentially cascade through the compartments over the second and third steps 312b-c, and then be removed from the compartment above the fourth step 312d. The first channel 340 (FIG. 5A) accordingly carries fluid from the lower orifices 334 where bubbles are less likely to collect to reduce the amount of gas that needs to cascade from the inner compartment above the first step 312a all the way out to the outer compartment. The bubbles in the secondary flow $F_2$ are more likely to collect at the top of the plenum 330 before passing through the channels 340-346. The upper orifices 332 are accordingly coupled to the second channel 342 and the third channel 344 to deliver these bubbles outward beyond the first step 312a so that they do not need to cascade through so many compartments. In this embodiment, the upper orifices 332 are not connected to the fourth channels 346 because this would create a channel that inclines downwardly from the common axis such that it may conflict with the groove 314 in the third step 312c. Thus, the fourth channel 346 extends from the lower orifices 334 to the fourth step 312d.

Referring again to FIG. 4, the primary flow guide 400 receives the primary fluid flow $F_p$ via the first inlet 320 of the distributor 300. In one embodiment, the primary flow guide 400 includes an inner baffle 410 and an outer baffle 420. The inner baffle can have a base 412 and a wall 414 projecting upward and radially outward from the base 412. The wall 414, for example, can have an inverted frusto-conical shape and a plurality of apertures 416. The apertures 416 can be holes, elongated slots or other types of openings. In the illustrated embodiment, the apertures 416 are annularly extending radial slots that slant upward relative to the common axis to project the primary flow radially inward and upward relative to the common axis along a plurality of diametrically opposed vectors. The inner baffle 410 can also includes a locking member 418 that couples the inner baffle 410 to the distributor 300.

The outer baffle 420 can include an outer wall 422 with a plurality of apertures 424. In this embodiment, the apertures 424 are elongated slots extending in a direction transverse to the apertures 416 of the inner baffle 410. The primary flow $F_p$ flows through (a) the first inlet 320, (b) the passageway 324 under the base 412 of the inner baffle 410, (c) the apertures 424 of the outer baffle 420, and then (d) the apertures 416 of the inner baffle 410. The combination of the outer baffle 420 and the inner baffle 410 conditions the direction of the flow at the exit of the apertures 416 in the inner baffle 410. The primary flow guide 400 can thus project the primary flow along diametrically opposed vectors that are inclined upward relative to the common axis to create a fluid flow that has a highly uniform velocity. In alternate embodiments, the apertures 416 do not slant upward relative to the common axis such that they can project the primary flow normal, or even downward, relative to the common axis.

FIG. 4 also illustrates an embodiment of the field shaping unit 500 that receives the primary fluid flow $F_p$ downstream from the primary flow guide 400. The field shaping unit 500 also contains the second fluid flow $F_2$ and shapes the electrical field within the reaction vessel 204. In this embodiment, the field shaping unit 500 has a compartment structure with a plurality of walls 510 (identified individually by reference numbers 510a-d) that define electrode compartments 520 (identified individually by reference numbers 520a-d). The walls 510 can be annular skirts or dividers, and they can be received in one of the annular grooves 314 in the distributor 300. In one embodiment, the walls 510 are not fixed to the distributor 300 so that the field shaping unit 500 can be quickly removed from the distributor 300. This allows easy access to the electrode compartments 520 and/or quick removal of the field shaping unit 500 to change the shape of the electric field.

The field shaping unit 500 can have at least one wall 510 outward from the primary flow guide 400 to prevent the primary flow $F_p$ from contacting an electrode. In the particular embodiment shown in FIG. 4, the field shaping unit 500 has a first electrode compartment 520a defined by a first wall 510a and a second wall 510b, a second electrode compartment 520b defined by the second wall 510b and a third wall 510c, a third electrode compartment 520c defined by the third wall 510c and a fourth wall 510d, and a fourth electrode compartment 520d defined by the fourth wall 510d and the outer wall 222 of the container 220. The walls 510a-d of this embodiment are concentric annular dividers that define annular electrode compartments 520a-d. Alternate embodiments of the field shaping unit can have walls with different configurations to create non-annular electrode compartments and/or each electrode compartment can be further divided into cells. The second-fourth walls 510b-d can also include holes 522 for allowing bubbles in the first-third electrode compartments 520a-c to "cascade" radially outward to the next outward electrode compartment 520 as explained above with respect to FIGS. 5A-5D. The bubbles can then exit the fourth electrode compartment 520d through an exit hole 525 through the outer wall 222. In an alternate embodiment, the bubbles can exit through an exit hole 524.

The electrode compartments 520 provide electrically discrete compartments to house an electrode assembly having at least one electrode and generally two or more electrodes 600 (identified individually by reference numbers 600a-d). The electrodes 600 can be annular members (e.g., annular rings or arcuate sections) that are configured to fit within annular electrode compartments, or they can have other shapes appropriate for the particular workpiece (e.g., rectilinear). In the illustrated embodiment, for example, the electrode assembly includes a first annular electrode 600a in the first electrode compartment 520a, a second annular electrode 600b in the second electrode compartment 520b, a third annular electrode 600c in the third electrode compartment 520c, and a fourth annular electrode 600d in the fourth electrode compartment 520d. As explained in U.S. application Ser. Nos. 60/206,661, 09/845,505, and 09/804,697, all of which are incorporated herein by reference, each of the electrodes 600a-d can be biased with the same or different potentials with respect to the workpiece to control the current density across the surface of the workpiece. In alternate embodiments, the electrodes 600 can be non-circular shapes or sections of other shapes.

Embodiments of the reaction vessel 204 that include a plurality of electrodes provide several benefits for plating or electropolishing. In plating applications, for example, the electrodes 600 can be biased with respect to the workpiece at different potentials to provide uniform plating on different workpieces even though the seed layers vary from one another or the bath(s) of electroprocessing solution have different conductivities and/or concentrations of constituents. Additionally, another the benefit of having a multiple electrode design is that plating can be controlled to achieve different final fill thicknesses of plated layers or different plating rates during a plating cycle or in different plating cycles. Other benefits of particular embodiments are that the current density can be controlled to (a) provide a uniform current density during feature filling and/or (b) achieve plating to specific film profiles across a workpiece (e.g., concave, convex, flat). Accordingly, the multiple electrode configurations in which the electrodes are separate from one another provide several benefits for controlling the electrochemical process to (a) compensate for deficiencies or differences in seed layers between workpieces, (b) adjust for variances in baths of electroprocessing solutions, and/or (c) achieve predetermined feature filling or film profiles.

The field shaping unit 500 can also include a virtual electrode unit coupled to the walls 510 of the compartment assembly for individually shaping the electrical fields produced by the electrodes 600. In the particular embodiment illustrated in FIG. 4, the virtual electrode unit includes first-fourth partitions 530a-530d, respectively. The first partition 530a can have a first section 532a coupled to the second wall 510b, a skirt 534 depending downward above the first wall 510a, and a lip 536a projecting upwardly. The lip 536a has an interior surface 537 that directs the primary flow $F_p$ exiting from the primary flow guide 400. The second partition 530b can have a first section 532b coupled to the third wall 510c and a lip 536b projecting upward from the first section 532b, the third partition 530c can have a first section 532c coupled to the fourth wall 510d and a lip 536c projecting upward from the first section 532c, and the fourth partition 530d can have a first section 532d carried by the outer wall 222 of the container 220 and a lip 536d projecting upward from the first section 532d. The fourth partition 530d may not be connected to the outer wall 222 so that the field shaping unit 500 can be quickly removed from the vessel 204 by simply lifting the virtual electrode unit. The interface between the fourth partition 530d and the outer wall 222 is sealed by a seal 527 to inhibit both the fluid and the electrical current from leaking out of the fourth electrode compartment 520d. The seal 527 can be a lip seal. Additionally, each of the sections 532a-d can be lateral sections extending transverse to the common axis.

The individual partitions 530a-d can be machined from or molded into a single piece of dielectric material, or they can be individual dielectric members that are welded together. In alternate embodiments, the individual partitions 530a-d are not attached to each other and/or they can have different configurations. In the particular embodiment shown in FIG. 4, the partitions 530a-d are annular horizontal members, and each of the lips 536a-d are annular vertical members arranged concentrically about the common axis.

The walls 510 and the partitions 530a-d are generally dielectric materials that contain the second flow $F_2$ of the processing solution for shaping the electric fields generated by the electrodes 600a-d. The second flow $F_2$, for example, can pass (a) through each of the electrode compartments 520a-d, (b) between the individual partitions 530a-d, and then (c) upward through the annular openings between the lips 536a-d. In this embodiment, the secondary flow $F_2$ through the first electrode compartment 520a can join the primary flow $F_p$ in an antechamber just before the primary flow guide 400, and the secondary flow through the second-fourth electrode compartments 520b-d can join the primary flow $F_p$ beyond the top edges of the lips 536a-d. The flow of electroprocessing solution then flows over a shield weir attached at rim 538 and into the gap between the housing 202 and the outer wall 222 of the container 220 as disclosed in International Application No. PCT/US00/10120. The fluid in the secondary flow $F_2$ can be prevented from flowing out of the electrode compartments 520a-d to join the primary flow $F_p$ while still allowing electrical current to pass from the electrodes 600 to the primary flow. In this alternate embodiment, the secondary flow $F_2$ can exit the reaction vessel 204 through the holes 522 in the walls 510 and the hole 525 in the outer wall 222. In still additional embodiments in which the fluid of the secondary flow does not join the primary flow, a duct can be coupled to the exit hole 525 in the outer wall 222 so that a return flow of the secondary flow passing out of the field shaping unit 500 does not mix with the return flow of the primary flow passing down the spiral ramp outside of the outer wall 222. The field shaping unit 500 can have other configurations that are different than the embodiment shown in FIG. 4. For example, the electrode compartment assembly can have only a single wall 510 defining a single electrode compartment 520, and the reaction vessel 204 can include only a single electrode 600. The field shaping unit of either embodiment still separates the primary and secondary flows so that the primary flow does not engage the electrode, and thus it shields the workpiece from the single electrode. One advantage of shielding the workpiece from the electrodes 600a-d is that the electrodes can accordingly be much larger than they could be without the field shaping unit because the size of the electrodes does not have an effect on the electrical field presented to the workpiece. This is particularly useful in situations that use consumable electrodes because increasing the size of the electrodes prolongs the life of each electrode, which reduces downtime for servicing and replacing electrodes.

An embodiment of reaction vessel 204 shown in FIG. 4 can accordingly have a first conduit system for conditioning and directing the primary fluid flow $F_p$ to the workpiece, and a second conduit system for conditioning and directing the secondary fluid flow $F_2$. The first conduit system, for example, can include the inlet 320 of the distributor 300; the channel 324 between the base 412 of the primary flow guide 400 and the inclined cavity 322 of the distributor 300; a plenum between the wall 422 of the outer baffle 420 and the first wall 510a of the field shaping unit 500; the primary flow guide 400; and the interior surface 537 of the first lip 536a. The first conduit system conditions the direction of the primary fluid flow $F_p$ by passing it through the primary flow guide 400 and along the interior surface 537 so that the velocity of the primary flow $F_p$ normal to the workpiece is at least substantially uniform across the surface of the workpiece. The primary flow $F_p$ and the rotation of the workpiece can accordingly be controlled to dominate the mass transfer of electroprocessing medium at the workpiece.

The second conduit system, for example, can include the plenum 330 and the channels 340-346 of the distributor 300, the walls 510 of the field shaping unit 500, and the partitions 530 of the field shaping unit 500. The secondary flow $F_2$ contacts the electrodes 600 to establish individual electrical fields in the field shaping unit 500 that are electrically coupled to the primary flow $F_p$. The field shaping unit 500, for example, separates the individual electrical fields created by the electrodes 600a-d to create "virtual electrodes" at the top of the openings defined by the lips 536a-d of the partitions. In this particular embodiment, the central opening inside the first lip 536a defines a first virtual electrode, the annular opening between the first and second lips 536a-b defines a second virtual electrode, the annular opening between the second and third lips 536b-c defines a third virtual electrode, and the annular opening between the third and fourth lips 536c-d defines a fourth virtual electrode. These are "virtual electrodes" because the field shaping unit 500 shapes the individual electrical fields of the actual electrodes 600a-d so that the effect of the electrodes 600a-d acts as if they are placed between the top edges of the lips 536a-d. This allows the actual electrodes 600a-d to be isolated from the primary fluid flow, which can provide several benefits as explained in more detail below.

An additional embodiment of the processing chamber 200 includes at least one interface member 700 (identified individually by reference numbers 700a-d) for further conditioning the secondary flow $F_2$ of electroprocessing solution. The interface members 700, for example, can be filters that capture particles in the secondary flow that were generated by the electrodes (i.e., anodes) or other sources of particles. The filter-type interface members 700 can also inhibit bubbles in the secondary flow $F_2$ from passing into the primary flow $F_p$ of electroprocessing solution. This effectively forces the bubbles to pass radially outwardly through the holes 522 in the walls 510 of the field shaping unit 500. In alternate embodiments, the interface members 700 can be ion-membranes that allow ions in the secondary flow $F_2$ to pass through the interface members 700. The ion-membrane interface members 700 can be selected to (a) allow the fluid of the electroprocessing solution and ions to pass through the interface member 700, or (b) allow only the desired ions to pass through the interface member such that the fluid itself is prevented from passing beyond the ion-membrane.

Figure 6:
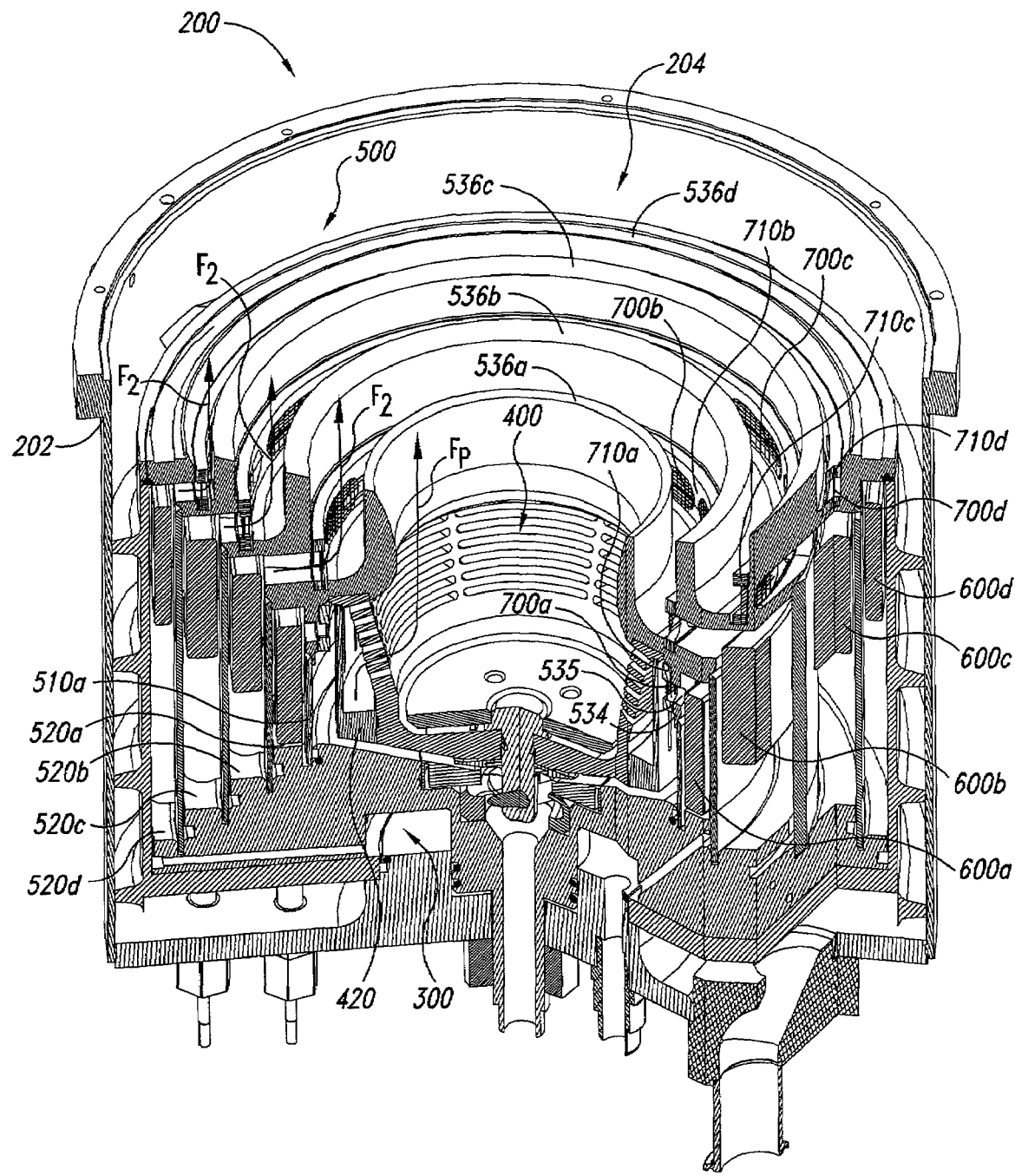
FIG. 6 is an isometric view showing a different cross-sectional portion of the processing chamber of FIG. 4 taken along line 6-6 of FIG. 8B.
Figure 8A:
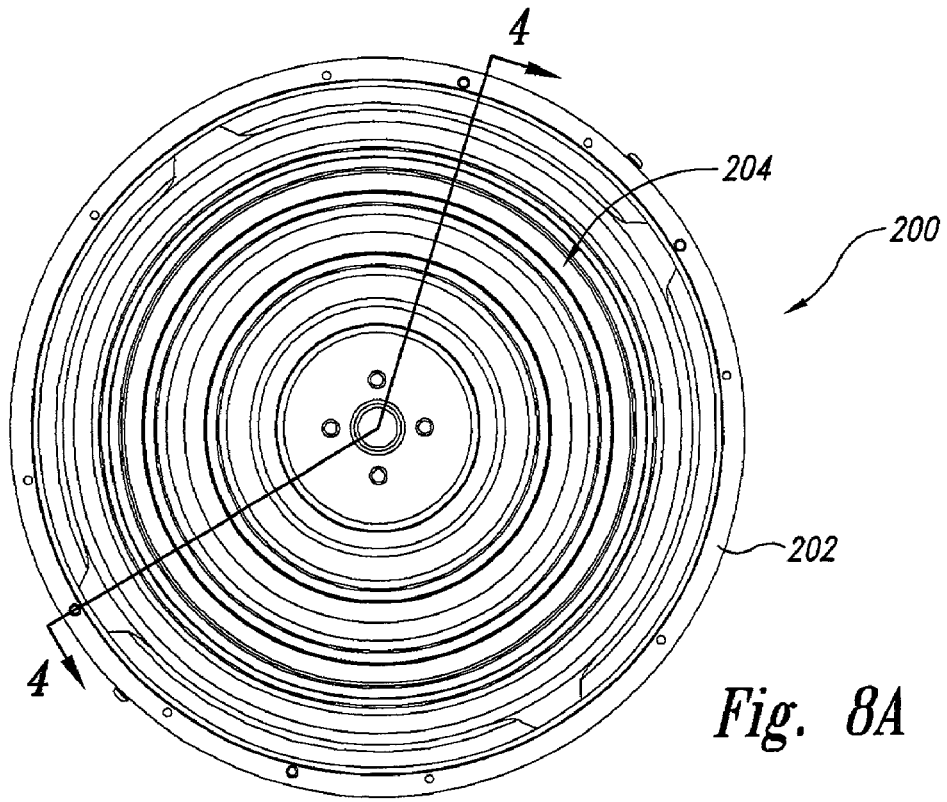
FIGS. 8A and 8B are top plan views of a processing chamber that provide a reference for the isometric, cross-sectional views of FIGS. 4 and 6, respectively.
Figure 8B:
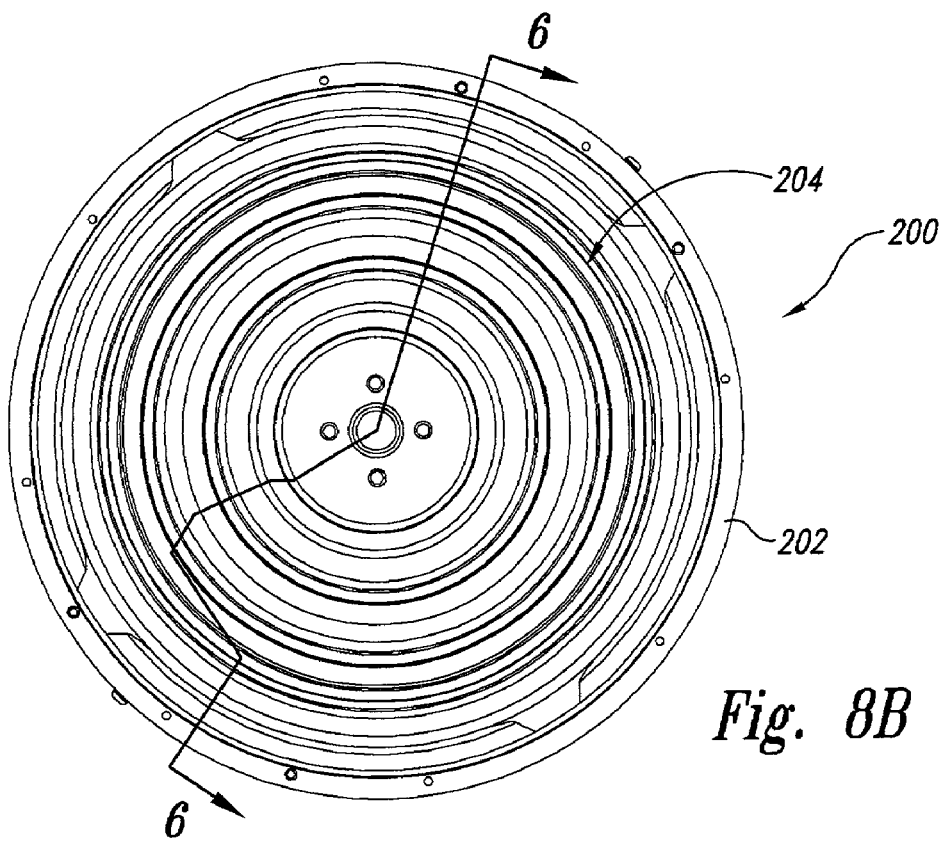

FIG. 6 is another isometric view of the reaction vessel 204 of FIG. 4 showing a cross-sectional portion taken along a different cross-section. More specifically, the cross-section of FIG. 4 is shown in FIG. 8A and the cross-section of FIG. 6 is shown in FIG. 8B. Returning now to FIG. 6, this illustration further shows one embodiment for configuring a plurality of interface members 700a-d relative to the partitions 530a-d of the field shaping unit 500. A first interface member 700a can be attached to the skirt 534 of the first partition 530a so that a first portion of the secondary flow $F_2$ flows past the first electrode 600a, through an opening 535 in the skirt 534, and then to the first interface member 700a. Another portion of the secondary flow $F_2$ can flow past the second electrode 600b to the second interface member 700b. Similarly, portions of the secondary flow $F_2$ can flow past the third and fourth electrodes 600c-d to the third and fourth interface members 700c-d.

When the interface members 700a-d are filters or ion-membranes that allow the fluid in the secondary flow $F_2$ to pass through the interface members 700a-d, the secondary flow $F_2$ joins the primary fluid flow $F_p$. The portion of the secondary flow $F_2$ in the first electrode compartment 520a can pass through the opening 535 in the skirt 534 and the first interface member 700a, and then into a plenum between the first wall 510a and the outer wall 422 of the baffle 420. This portion of the secondary flow $F_2$ accordingly joins the primary flow $F_p$ and passes through the primary flow guide 400. The other portions of the secondary flow $F_2$ in this particular embodiment pass through the second-fourth electrode compartments 520b-d and then through the annular openings between the lips 536a-d. The second-fourth interface members 700b-d can accordingly be attached to the field shaping unit 500 downstream from the second-fourth electrodes 600b-d.

In the particular embodiment shown in FIG. 6, the second interface member 700b is positioned vertically between the first and second partitions 530a-b, the third interface member 700c is positioned vertically between the second and third partitions 530b-c, and the fourth interface member 700d is positioned vertically between the third and fourth partitions 530c-d. The interface assemblies 710a-d are generally installed vertically, or at least at an upwardly inclined angle relative to horizontal, to force the bubbles to rise so that they can escape through the holes 522 in the walls 510a-d (FIG. 4). This prevents aggregations of bubbles that could potentially disrupt the electrical field from an individual electrode.

Figure 7A:
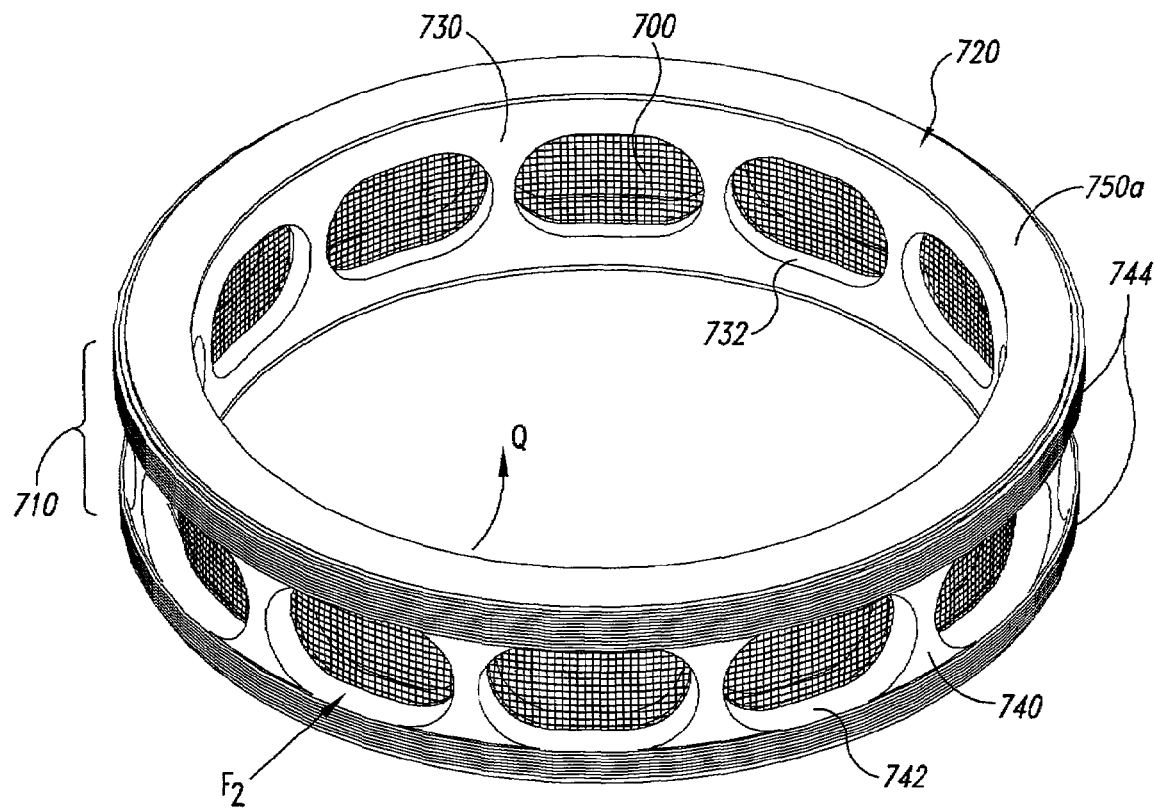
FIG. 7A is an isometric view of an interface assembly for use in a processing chamber in accordance with an embodiment of the invention.
Figure 7B:
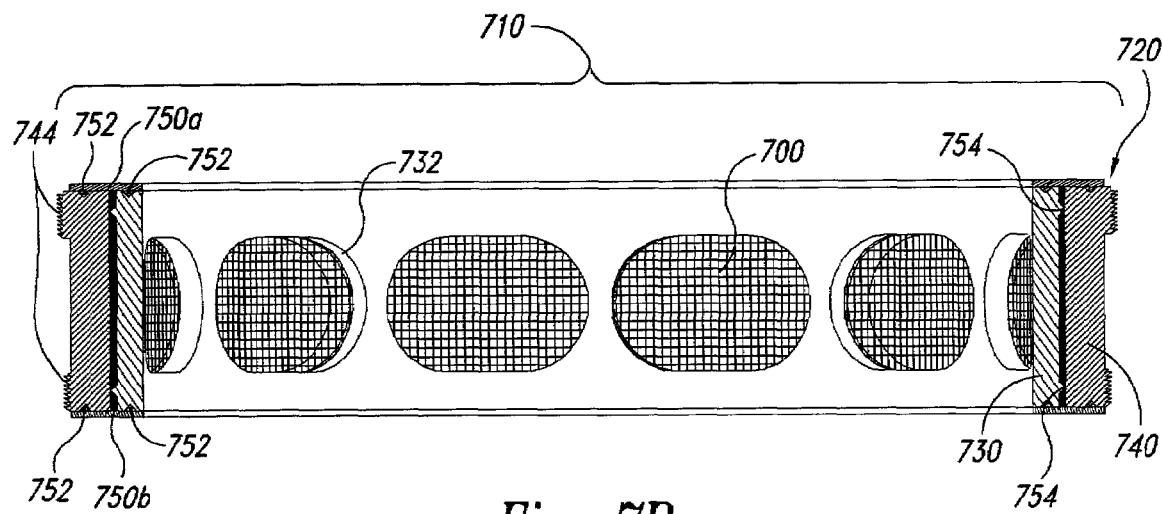
FIG. 7B is a cross-sectional view of the interface assembly of FIG. 7A.

FIGS. 7A and 7B illustrate an interface assembly 710 for mounting the interface members 700 to the field shaping unit 500 in accordance with an embodiment of the invention. The interface assembly 710 can include an annular interface member 700 and a fixture 720 for holding the interface member 700. The fixture 720 can include a first frame 730 having a plurality of openings 732 and a second frame 740 having a plurality of openings 742 (best shown in FIG. 7A). The holes 732 in the first frame can be aligned with the holes 742 in the second frame 740. The second frame can further include a plurality of annular teeth 744 extending around the perimeter of the second frame. It will be appreciated that the teeth 744 can alternatively extend in a different direction on the exterior surface of the second frame 740 in other embodiments, but the teeth 744 generally extend around the perimeter of the second frame 740 in a top annular band and a lower annular band to provide annular seals with the partitions 536a-d (FIG. 6). The interface member 700 can be pressed between the first frame 730 and the second frame 740 to securely hold the interface member 700 in place. The interface assembly 710 can also include a top band 750a extending around the top of the frames 730 and 740 and a bottom band 750b extending around the bottom of the frames 730 and 740. The top and bottom bands 750a-b can be welded to the frames 730 and 740 by annular welds 752. Additionally, the first and second frames 730 and 740 can be welded to each other by welds 754. It will be appreciated that the interface assembly 710 can have several different embodiments that are defined by the configuration of the field shaping unit 500 (FIG. 6) and the particular configuration of the electrode compartments 520a-d (FIG. 6).

When the interface member 700 is a filter material that allows the secondary flow $F_2$ of electroprocessing solution to pass through the holes 732 in the first frame 730, the post-filtered portion of the solution continues along a path (arrow Q) to join the primary fluid flow $F_p$ as described above. One suitable material for a filter-type interface member 700 is POREX®, which is a porous plastic that filters particles to prevent them from passing through the interface member. In plating systems that use consumable anodes (e.g., phosphorized copper or nickel sulfamate), the interface member 700 can prevent the particles generated by the anodes from reaching the plating surface of the workpiece.

In alternate embodiments in which the interface member 700 is an ion-membrane, the interface member 700 can be permeable to preferred ions to allow these ions to pass through the interface member 700 and into the primary fluid flow $F_p$. One suitable ion-membrane is NAFION® perfluorinated membranes manufactured by DuPont®. In one application for copper plating, a NAFION 450 ion-selective membrane is used. Other suitable types of ion-membranes for plating can be polymers that are permeable to many cations, but reject anions and non-polar species. It will be appreciated that in electropolishing applications, the interface member 700 may be selected to be permeable to anions, but reject cations and nonpolar species. The preferred ions can be transferred through the ion-membrane interface member 700 by a driving force, such as a difference in concentration of ions on either side of the membrane, a difference in electrical potential, or hydrostatic pressure.

Using an ion-membrane that prevents the fluid of the electroprocessing solution from passing through the interface member 700 allows the electrical current to pass through the interface member while filtering out particles, organic additives and bubbles in the fluid. For example, in plating applications in which the interface member 700 is permeable to cations, the primary fluid flow $F_p$ that contacts the workpiece can be a catholyte and the secondary fluid flow $F_2$ that does not contact the workpiece can be a separate anolyte because these fluids do not mix in this embodiment. A benefit of having separate anolyte and catholyte fluid flows is that it eliminates the consumption of additives at the anodes and thus the need to replenish the additives as often. Additionally, this feature combined with the "virtual electrode" aspect of the reaction vessel 204 reduces the need to "burn-in" anodes for insuring a consistent black film over the anodes for predictable current distribution because the current distribution is controlled by the configuration of the field shaping unit 500. Another advantage is that it also eliminates the need to have a predictable consumption of additives in the secondary flow $F_2$ because the additives to the secondary flow $F_2$ do not effect the primary fluid flow $F_p$ when the two fluids are separated from each other.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

The invention claimed is:

1. A reactor apparatus for electrochemical processing of microelectronic workpieces, comprising:
   a reaction vessel;
   a first outlet configured to introduce a primary flow of a first processing solution into the reaction vessel;
   at least one second outlet configured to introduce a secondary flow of a second processing solution different than the first processing solution into the reaction vessel separate from the primary flow;
   a dielectric field shaping unit in the reaction vessel to receive the secondary flow from the second outlet, the field shaping unit being configured to contain the secondary flow separate from the primary flow through at least a portion of the reaction vessel, and the field shaping unit having at least one electrode compartment through which the secondary flow can pass while the secondary flow is separate from the primary how;
   an electrode in the electrode compartment; and
   an ion-membrane carried by the field shaping unit downstream from the electrode, the ion-membrane being in fluid communication with the second flow in the electrode compartment, and the ion-membrane being configured to be at least substantially impermeable to fluids of the secondary flow and the primary flow.

2. The apparatus of claim 1, further comprising a primary flow guide including:
   a first baffle having a plurality of first apertures through which at least the primary flow can pass; and
   a second baffle downstream from the first baffle, the second baffle having a plurality of second apertures through which the primary flow can pass after passing through the first apertures.

3. The apparatus of claim 1, further comprising a primary flow guide including:
   an annular outer baffle centered on a common axis, the outer baffle having a plurality of first apertures; and
   an annular inner baffle positioned concentrically inside the outer baffle, the inner baffle having a plurality of second apertures, wherein the primary flow passes through the first apertures of the outer baffle and then through the second apertures of the inner baffle.

4. The apparatus of claim 1, further comprising a primary flow guide including:
   an annular outer baffle centered on a common axis, the outer baffle having a plurality of generally vertical slots; and
   an annular inner baffle positioned concentrically inside the outer baffle, the inner baffle having an inverted frusto-conical shaped wall with a plurality of annularly extending radial slots that slant upward relative to the common axis, wherein the primary flow passes through the vertical slots of the outer baffle and then through the annular slots of the inner baffle to project radially inward and upward relative to the common axis along a plurality of diametrically opposed vectors.

5. The apparatus of claim 1 wherein the field shaping unit comprises a dielectric wall disposed within an outer wall of the reaction vessel and the electrode compartment is between the dielectric wall and the outer wall, wherein the secondary flow passes through the electrode compartment on one side of the dielectric wall and the primary flow passes on another side of the dielectric well.

6. The apparatus of claim 1 wherein the field shaping unit comprises an annular wall in the reaction vessel, the annular wall being spaced radially inward of an outer wall to define a center opening centered on a common axis and the electrode compartment being between the annular wall and the outer wall such that the primary flow passes through the center opening and the secondary flow passes through the electrode compartment.

7. The apparatus of claim 1 wherein:
   the field shaping unit comprises a first annular wall centered on a common axis in the reaction vessel, the first annular wall being spaced radially inward of an outer wall, and a second annular wall in the reaction vessel concentric with first annular wall and between the first annular wall and the outer wall, wherein an inner surface of the second annular wall defines an outer side of a first electrode compartment and an outer surface of the second annular wall defines an inner side of a second electrode compartment; and
   the apparatus further comprises a first annular electrode in the first electrode compartment and a second annular electrode in the second electrode compartment.

8. The apparatus of claim 1 wherein:
   the field shaping unit comprises—
      a first annular wall in the reaction vessel centered on a common axis, the first annular wall being spaced radially inward of an outer wall of the reaction vessel,
      a second annular wall in the reaction vessel concentric with first annular wall and between the first annular wall and the outer wall, wherein an inner surface of the second annular wall defines an outer side of a first electrode compartment and an outer surface of the second annular wall defines an inner side of a second electrode compartment, and a virtual electrode unit having a first partition and a second partition, the first partition having a first lateral section coupled to the first and second annular walls and a first annular lip projecting from the first lateral section to define an interior flow path for the primary flow, and a second partition having a second lateral section above the first lateral section and a second annular lip projecting from the second lateral section, the second annular lip surrounding the first annular lip to define an annular opening therebetween; and the apparatus further comprises a first annular electrode in the first electrode compartment and a second annular electrode in the second electrode compartment.

9. The apparatus of claim 1, further comprising a distributor coupled to the reaction vessel, the distributor having a central outlet defining the first outlet and a plurality of outer outlets defining second outlets.

10. The apparatus of claim 9 wherein the distributor comprises:

an inlet for receiving the primary flow and an annular cavity coupled to the inlet, the annular cavity defining the central outlet;

a plenum separate from the inlet for receiving the secondary flow, a plurality of upper orifices in an upper part of the plenum, a plurality of lower orifices in a lower part of the plenum, and a plurality of channels extending from the orifices to corresponding outer outlets.

11. The apparatus of claim 9 wherein the distributor comprises:

an annular body having a plurality of annular steps;

an inlet extending through the body for receiving the primary flow;

a plenum separate from the inlet for receiving the secondary flow, a plurality of upper orifices in an upper part of the plenum, and a plurality of lower orifices in a lower part of the plenum; and a plurality of channels extending from the orifices to corresponding outer outlets at the steps of the annular body.

12. A reactor for an electrochemical processing chamber used to process microelectronic workpieces, comprising:

a reaction vessel;

a distributor in the reaction vessel, the distributor having a first outlet configured to introduce a primary flow into the reaction vessel and at least one second outlet configured to introduce a secondary flow into the reaction vessel separate from the primary flow;

a dielectric field shaping unit in the reaction vessel, the field shaping unit being configured to receive the secondary flow from the second outlet and contain the secondary flow separate from the primary flow through at least a portion of the reaction vessel, and the field shaping unit having at least one electrode compartment through which the secondary flow can pass while the secondary flow is separate from the primary flow;

an electrode in the electrode compartment; and an ion-membrane member in the reaction vessel downstream from the electrode, the ion-membrane being in fluid communication with the secondary flow in the electrode compartment, and the ion-membrane being configured to be at least substantially impermeable to fluids of the primary flow and the secondary flow.

13. The apparatus of claim 12, further comprising a primary flow guide including:

an annular outer baffle centered on a common axis, the outer baffle having a plurality of first apertures; and an annular inner baffle positioned concentrically inside the outer baffle, the inner baffle having a plurality of second apertures, wherein the primary flow passes through the first apertures of the outer baffle and then through the second apertures of the inner baffle.

14. The apparatus of claim 12, further comprising a primary flow guide including:

a first baffle having a plurality of first apertures through which at least the primary flow can pass; and a second baffle downstream from the first baffle, the second baffle having a plurality of second apertures through which the primary flow can pass after passing through the first apertures.

15. The apparatus of claim 12 wherein the field shaping unit comprises a dielectric wall disposed within an outer wall of the reaction vessel and the electrode compartment is between the dielectric wall and the outer wall, wherein the secondary flow passes through the electrode compartment on one side of the dielectric wall and the primary flow passes on another side of the dielectric wall.

16. The apparatus of claim 12 wherein:

the field shaping unit comprises a first annular wall centered on a common axis in the reaction vessel, the first annular wall being spaced radially inward of an outer wall of the reaction vessel, and a second annular wall in the reaction vessel concentric with first annular wall and between the first annular wall and the outer wall, wherein an inner surface of the second annular wall defines an outer side of a first electrode compartment and an outer surface of the second annular wall defines an inner side of a second electrode compartment; and the apparatus further comprises a first annular electrode in the first electrode compartment and a second annular electrode in the second electrode compartment.

17. The apparatus of claim 12 wherein:

the field shaping unit comprises— a first annular wall in the reaction vessel centered on a common axis, the first annular wall being spaced radially inward of an outer wall of the reaction vessel, a second annular wall in the reaction vessel concentric with first annular wall and between the first annular wall and the outer wall, wherein an inner surface of the second annular wall defines an outer side of a first electrode compartment and an outer surface of the second annular wall defines an inner side of a second electrode compartment, and a virtual electrode unit having a first partition and a second partition, the first partition having a first lateral section coupled to the first and second annular walls and a first annular lip projecting from the first lateral section to define an interior flow path for the primary flow, and a second partition having a second lateral section above the first lateral section and a second annular lip projecting from the second lateral section, the second annular lip surrounding the first annular lip to define an annular opening therebetween; and the apparatus further comprises a first annular electrode in the first electrode compartment and a second annular electrode in the second electrode compartment.

18. The apparatus of claim 12 wherein the distributor comprises:
an inlet for receiving the primary flow, the first outlet being in fluid communication with the inlet; and
a plenum separate from the inlet for receiving the secondary flow, a plurality of upper orifices in an upper part of the plenum, a plurality of lower orifices in a lower part of the plenum, and a plurality of channels extending from the orifices to a plurality of outer outlets, wherein the outer outlets define second outlets.

19. The apparatus of claim 12 wherein the distributor comprises:
an annular body having a plurality of annular steps;
an inlet extending through the body for receiving the primary flow, the first outlet being in fluid communication with the inlet;
a plenum separate from the inlet for receiving the secondary flow, a plurality of upper orifices in an upper part of the plenum, and a plurality of lower orifices in a lower part of the plenum; and
a plurality of channels extending from the orifices to a plurality of outer outlets at the steps of the annular body, the outer outlet defining second outlets.

20. A reaction vessel for an electrochemical processing chamber used to process microelectronic workpieces, comprising:
a container having an upper portion with a workpiece processing zone;
a plurality of compartments in the lower portion of the container including at least a first electrode compartment and a second electrode compartment separate from the first electrode compartment through at least a portion of the container, the electrode compartments being configured to contain an electrochemical processing solution;
a plurality of separate electrodes including at least a first electrode in the first electrode compartment and a second electrode in the second electrode compartment;
at least a first ion-membrane between the first electrode and the workpiece processing zone, the first ion-membrane being configured to allow selected ions to pass across the first ion-membrane; and
a fluid flow system configured to direct a first fluid flow through the first and second electrode compartments and to direct a second fluid flow through the upper portion of the container, wherein the ion-membrane separates the first fluid flow from the second fluid flow and is at least substantially impermeable to fluids of the first fluid flow and the second fluid flow.

21. The reaction vessel of claim 20, further comprising a second ion-membrane at the second electrode compartment between the second electrode and the workpiece site, and wherein the second ion-membrane is configured to allow the selected ions to pass across the second ion-membrane.

22. The reaction vessel of claim 20, further comprising:
a first annular wall inside the container and a second annular wall inside the container, the second annular wall being between the first annular wall and the outer wall, and wherein a first annular space between the first annular wall and the second annular wall defines the first electrode compartment and a second annular space outside of the second annular wall defines the second electrode compartment; and
wherein the first electrode is a first annular electrode in the first electrode compartment, and the second electrode is a second annular electrode in the second electrode compartment.

23. The reaction vessel of claim 20, wherein:
the reaction vessel further comprises a first annular wall inside the container and a second annular wall inside the container, the second annular wall being between the first annular wall and the outer wall, and wherein a first annular space between the first annular wall and the second annular wall defines the first electrode compartment and a second annular space outside of the second annular wall defines the second electrode compartment; and
the first electrode is a first annular electrode in the first electrode compartment, and the second electrode is a second annular electrode in the second electrode compartment.

24. The reaction vessel of claim 20 wherein the first ion-membrane is impermeable to fluids in the processing solution.

25. The reaction vessel of claim 20, further comprising:
a dielectric field shaping unit in the reaction vessel configured to receive the processing solution, the field shaping unit having first and second walls configured to define the first and second electrode compartments, and the first wall having an opening.

26. An apparatus for electrochemically processing a microelectronic workpiece, comprising:
a processing station comprising—
a head assembly having a contact assembly configured to hold a microelectronic workpiece in a processing position and a plurality of contacts configured to contact a portion of the workpiece in the processing position; and
a processing chamber having a reaction vessel;
a first outlet configured to introduce a primary flow of a first processing solution into the reaction vessel;
at least one second outlet configured to introduce a secondary flow of a second processing solution different than the first processing solution into the reaction vessel separate from the primary flow;
a dielectric field shaping unit in the reaction vessel coupled to the second outlet to receive the secondary flow, the field shaping unit being configured to contain the secondary flow separate from the primary flow through at least a portion of the reaction vessel, and the field shaping unit having at least one electrode compartment through which the secondary flow can pass while the secondary flow is separate from the primary flow;
an electrode in the electrode compartment; and
an ion-membrane carried by the field shaping unit downstream from the electrode, the ion-membrane being in fluid communication with the second flow in the electrode compartment, and the ion-membrane being configured to be at least substantially impermeable to fluids of the secondary flow and the primary flow.

* * * * *